United States Patent
Ishizaki et al.

(10) Patent No.: US 6,456,172 B1
(45) Date of Patent: Sep. 24, 2002

(54) MULTILAYERED CERAMIC RF DEVICE

(75) Inventors: Toshio Ishizaki, Kobe (JP); Toru Yamada, Katano (JP); Hiroshi Kagata, Hirakata (JP); Makoto Sakakura, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/692,546

(22) Filed: Oct. 20, 2000

(30) Foreign Application Priority Data

Oct. 21, 1999 (JP) .......................... 11-299685

(51) Int. Cl.⁷ .............................. H03H 9/72
(52) U.S. Cl. .................. 333/133; 333/204; 333/193
(58) Field of Search .............................. 333/133, 189, 333/26, 185, 104, 103, 204

(56) References Cited

U.S. PATENT DOCUMENTS

| | | | |
|---|---|---|---|
| 4,699,682 A | 10/1987 | Takishima | 156/292 |
| 4,899,118 A | 2/1990 | Polinski, Sr. | 333/246 |
| 5,157,364 A | 10/1992 | Pond et al. | 333/203 |
| 5,258,800 A | 11/1993 | Seki et al. | 354/402 |
| 5,262,595 A * | 11/1993 | Yano et al. | 174/258 |
| 5,373,190 A | 12/1994 | Ichiyama | 257/737 |
| 5,396,201 A | 3/1995 | Ishizaki et al. | 333/204 |
| 5,406,235 A | 4/1995 | Hayashi | 333/204 |
| 5,459,368 A * | 10/1995 | Onishi et al. | 310/313 R |
| 5,600,541 A | 2/1997 | Bone et al. | 361/707 |
| 5,786,738 A * | 7/1998 | Ikata et al. | 333/133 |
| 5,929,510 A * | 7/1999 | Geller et al. | 257/635 |
| 5,982,250 A * | 11/1999 | Hung et al. | 333/26 |
| 5,999,065 A * | 12/1999 | Furutani et al. | 333/103 |
| 6,060,960 A * | 5/2000 | Tanaka et al. | 333/104 |
| 6,157,084 A * | 12/2000 | Hino et al. | 257/773 |
| 6,232,251 B1 * | 5/2001 | Terashi et al. | 501/5 |

FOREIGN PATENT DOCUMENTS

| | | | |
|---|---|---|---|
| EP | 0 820 155 | 1/1998 | H04B/1/52 |
| EP | 0 837 516 | 4/1998 | H01P/1/15 |
| EP | 1 014 592 A2 * | 6/2000 | H04B/1/52 |
| JP | 05075263 | 3/1993 | H05K/3/46 |
| JP | 10308584 | 11/1998 | H05K/3/46 |

* cited by examiner

Primary Examiner—Robert Pascal
Assistant Examiner—Dean Takaoka
(74) Attorney, Agent, or Firm—Wenderoth, Lind & Ponack, L.L.P.

(57) ABSTRACT

A multilayered ceramic RF device having at least one radio frequency filter includes a low temperature-cofired multilayered ceramic body having a plurality of ceramic layers laminated one upon another and fired together. The low temperature-cofired multilayered ceramic body also has a first electrode pattern formed therein and a second electrode pattern formed thereon. The first and second electrode patterns are electrically connected to one another through a via hole. A bare semiconductor chip is mounted on the low temperature-cofired multilayered ceramic body with a face down bonding, and the bare semiconductor chip is coated with a sealing resin. The at least one radio frequency filter is a multilayered filter formed in the low temperature-cofired multilayered ceramic body, and the multilayered filter includes a part of the first and second electrode patterns.

23 Claims, 12 Drawing Sheets

MULTILAYERED CERAMIC RF DEVICE

BACKGROUND OF THE INVENTION

1. Field of the Invention

The present invention relates generally to a multilayered ceramic RF (radio frequency) device, and in particular but not exclusively, to a multilayered ceramic RF device used in high-frequency radio equipment such as a cellular telephone.

2. Description of the Related Art

Recently multilayered ceramic RF devices are attracting much attention for their ability to contribute greatly to the size reduction of high-frequency radio equipment such as a cellular telephone.

FIG. 15 is a block diagram showing an example of an RF circuit used in a cellular telephone. A duplexer 22 is formed of a transmitting filter and a receiving-filter. In such an RF circuit as show in FIG. 15, a transmitting signal amplified by a power amplifier 21 passes through a low-pass filter 20 and the transmitting filter in the duplexer 22 and is transmitted from an antenna 24. A band-pass filter may be used instead of the low-pass filter 20. A signal received by the antenna 24 is input to a low-noise amplifier 28 via the receiving filter in the duplexer 22 and a band-pass filter 26. The signal is amplified by the low-noise amplifier 28 and, after that, the signal is subjected to a frequency conversion and a signal processing. While the low-pass filter 20 and the duplexer 22 can be constituted from multilayered filters or the like, the band-pass filter 26 is normally constituted from a SAW filter. The power amplifier 21 and the low-noise amplifier 28 are made by using semiconductor elements with excellent radio frequency characteristics.

Now an example of the multilayered ceramic RF device of the prior art will be described below with reference to FIG. 16 and FIG. 17.

FIG. 16 is a sectional view of a multilayered ceramic RF device 100 of the prior art which constitutes a part of the RF circuit shown in FIG. 15. In the multilayered ceramic RF device 100 of the prior art, electrode patterns 102 which constitute the RF circuit are formed in a low temperature-cofired multilayered ceramic body 101. The electrode patterns 102 are electrically connected to each other by means of via holes 103. Chip components 105 such as chip resistors, chip capacitors, chip inductors and packaged semiconductor elements are formed on the surface of the low temperature-cofired multilayered ceramic body 101, and are shielded by a metal cap 107.

The operation of the multilayered ceramic RF device 100 of the prior art constituted as described above will be described below.

The electrode patterns 102 form inner layer capacitors and inner layer inductors in the low temperature-cofired multilayered ceramic body 101 as well as providing electrical connection between the plurality of chip components 105. These components collectively form the RF circuit and serve as a multilayered ceramic RF device such as, for example, a multilayer RF switch.

FIG. 17 schematically shows an example of the constitution of an RF device 120 of the prior art used in a cellular telephone that has the RF circuit as shown in FIG. 15. As shown in FIG. 17, the RF device 120 of the prior art has been constituted from separate components such as an multilayered filter 110, a SAW filter 112 covered with a ceramic package 111, and the mutilayered ceramic RF device 100 formed of a multilayered ceramic body having an RF switching circuit 114, which are independent from each other. Thus the RF device 120 of the prior art shown in FIG. 17 has been made by mounting the multilayered filter 110, the SAW filter 112 covered with a ceramic package 111, and the multilayered ceramic RF device 100 that are independent from each other on a printed circuit board and connecting the components by soldering or using micro strip lines.

In the constitution of the RF device 120 of the prior art, however, there has been such a problem that the use of soldering lands or running the micro strip lines on the printed circuit board causes unmatched impedance and/or an increase in impedance loss. Also because connection of the components is carried out in the final packaging stage of the production process, even when the components have been certified for satisfactory radio frequency characteristics before connection, there occur variations in the high-frequency characteristics of the components due to unmatched impedance in junctions or the like after the components have been connected in the final packaging stage. As a result, it has been difficult to produce the RF device 120 of the prior art with excellent radio frequency characteristics and excellent reproducibility.

Also in the multilayered ceramic RF device 100 of the prior art shown in FIG. 16, since a bare semiconductor chip (i.e., a chip that is not molded) and a SAW filter need to be sealed, these components cannot be used in the device 100. This is because the metal cap 107 of the prior art is used for the purpose of merely providing an electromagnetic shielding and does not have the sealing function. Therefore, it is necessary to use the semiconductor element and the SAW filter that are individually sealed, which makes it difficult to reduce the device size and leads to a complicated manufacturing process.

SUMMARY OF THE INVENTION

The present invention has been developed to overcome the above-described disadvantages.

It is accordingly an objective of the present invention to provide a multilayered ceramic RF device that has excellent radio frequency characteristics and high reliability.

Another object of the present invention is to provide a multilayered ceramic RF device that has high performance, and is small in size and in profile and easy to produce.

In accomplishing the above and other objectives, a multilayered ceramic RF device of the present invention having at least one radio frequency filter, includes a low temperature-cofired multilayered ceramic body having a plurality of ceramic layers laminated one upon another and fired together, the low temperature-cofired multilayered ceramic body also having a first electrode pattern formed therein and a second electrode pattern formed thereon. The first and second electrode patterns are electrically connected to-one another through a-via hole. A bare semiconductor chip (i.e., a chip that is not molded) is mounted on the low temperature-cofired multilayered ceramic body with a face down bonding, and the bare semiconductor chip is coated with a sealing resin. The least one radio frequency filter is a multilayered filter formed in the low temperature-cofired multilayered ceramic body, and the multilayered filter includes a part of the first and second electrode patterns.

In the multilayered ceramic RF device of the present invention, the electrode patterns formed on the surface and inside of the low temperature-cofired multilayered ceramic body are electrically connected with each other by via holes (holes that penetrate the ceramic layer and are filled with, for example, Ag or Cu), and the radio frequency filter is a multilayered filter formed inside of the multilayered ceramic body while including a part of the electrode patterns. Thus the connection between the multilayered filters, between the multilayered filter and another radio frequency filter or between the multilayered filter and a bare semiconductor chip can be made with very short wiring a distances by using the via holes or the like that are formed inside the multilayered ceramic body. As a result, unmatched impedance and impedance loss can be decreased, ripple in the pass band of the radio frequency filter can be prevented and proper performance of the filter can be realized, compared to the RF device of the prior art having components such as the radio frequency filter and the multilayered filter individually mounted on the printed circuit board. Therefore, the multilayered ceramic RF device that has excellent high-frequency characteristics and high reliability can be provided. Also the device can be made small in size and in profile with a reduced number of components, and can be produced in a simplified process.

The multilayered filter may be formed as a distributed constant multilayered filter that has a strip line resonator, and the strip line resonator can be formed to include a strip line resonator electrode that is formed as the part of the electrode patterns.

The multilayered filter may be formed as a lumped constant multilayered filter including a capacitor electrode and an inductor electrode, and the capacitor electrode and the inductor electrode can be formed as the part of the electrode patterns.

In the case where the multilayered ceramic RF device includes two or more radio frequency filters, at least one of the two or more radio frequency filters may be a SAW filter.

The multilayered ceramic RF device can be sealed easily, provided that the multilayered ceramic body has a cavity formed therein substantially at a center thereof, and the bare semiconductor chip is mounted at a bottom of the cavity in which the sealing resin is filled so as to cover the bare semiconductor chip. Also, because the sealing resin can be prevented from spreading to the side face of the multilayered ceramic body, a defect in production such as when the sealing resin covers the side electrode can be prevented from occurring when the side electrodes are provided on the multilayered ceramic body.

Such a constitution may also be employed as a plurality of ceramic layers including a first ceramic layer that has a first relative dielectric constant and a second ceramic layer that has a second relative dielectric constant that is different from the first relative dielectric constant. This constitution makes it possible to provide an element (an element formed to have the part of the electrode patterns in the multilayered ceramic body) that is suited to include the first ceramic layer which has the first relative dielectric constant formed on the first ceramic layer, and provide an element that is suited to include the second ceramic layer which has the second relative dielectric constant formed on the second ceramic layer. Thus the multilayered ceramic RF device that has high reliability can be provided.

Preferably, the plurality of ceramic layers include a top layer, a bottom layer, and an intermediate layer sandwiched between the top layer and the bottom layer, and the intermediate layer is formed of the first ceramic layer with a first relative dielectric constant. Both the top layer and the bottom layer are formed of the second ceramic layer with a second relative dielectric constant. This makes it possible to reduce the warp of the ceramic layers during firing. Moreover, since the elements formed to have the part of the electrode patterns in the multilayered ceramic body can be formed in the ceramic layer that has a relative dielectric constant most suitable for the element, the multilayered ceramic RF device having further higher reliability can be provided. The first relative dielectric constant is preferably greater than or equal to 10, and the second relative dielectric constant is preferably smaller than 10.

In the case where the-bare semiconductor chip is connected to the multilayered filter, the bare semiconductor chip is preferably placed over the multilayered filter. That is, when the area of the electrode patterns included in the multilayered filter is substantially equal to the sectional area of the bare semiconductor chip (area of the section perpendicular to the laminating direction of the ceramic layers included in the multilayered filter) and the bare semiconductor chip is arranged so as to overlap the multilayered filter, the bare semiconductor chip and the multilayered filter can be connected with the shortest wiring length. As a result, the size of the multilayered ceramic RF device can be made even smaller.

According to the present invention, the multilayered ceramic RF device having at least one radio frequency filter, includes a low temperature-cofired multilayered ceramic body having a plurality of ceramic layers laminated one upon another and fired together, and having a cavity therein. A first electrode pattern is formed therein and a second electrode pattern is formed thereon, the first and second electrode patterns being electrically connected to one another through a via hole. At least one of a bare semiconductor chip and a SAW filter is mounted at a bottom of the cavity, and a sealing metal cover seals the cavity hermetically. The at least one radio frequency filter is a multilayered filter formed in the low temperature-cofired multilayered ceramic body, and the multilayered filter includes a part of the first and second electrode patterns. Since the low temperature-cofired multilayered ceramic body has the cavity on the top surface thereof with at least one of the bare semiconductor chip and the SAW filter mounted at the bottom of the cavity and the cavity is hermetically sealed with a sealing metal cover, the at least one of the bare semiconductor chip and the SAW filter can be incorporated in the low temperature-cofired multilayered ceramic body. As a result, a more compact multilayered ceramic RF device can be made and hermetic sealing can be easily achieved.

The multilayered filter may be formed as a distributed constant multilayered filter that has a strip line resonator, and the strip line resonator can be formed to include a strip line resonator electrode that is formed as the part of the electrode patterns. In case the strip line resonator electrode is formed in the multilayered ceramic body in a region other than where the cavity is formed on the top surface, sufficient thickness of the strip line resonator electrode can be secured without increasing the device height.

When the strip line resonator electrode is formed in the multilayered ceramic body, it is preferable to form the plurality of ceramic layers included in the multilayered ceramic body from the intermediate layer having a low dielectric constant (first relative dielectric constant) and the top layer and the bottom layer that have a high dielectric constant (second relative dielectric constant), and provide the strip line resonator electrode on the bottom layer having the high dielectric constant. This makes it possible to form the strip line resonator electrode of smaller size.

The multilayered ceramic RF device may also have a radio frequency switching circuit that includes a capacitor electrode and an inductor electrode. The electrode patterns formed in the low temperature-cofired multilayered ceramic body may include at least one of the capacitor electrode and the inductor electrode. When the multilayered ceramic RF device additionally has the radio frequency switching circuit such as the above, the multilayered ceramic RF device having more versatile functions can be provided.

If the multilayered ceramic RF device is used for both of a W-CDMA (wideband code division multiple access) and a GSM (global system for mobile communication), it is preferable that the multilayered filter is the transmitting filter of the WCDMA, the SAW filter is a receiving filter for the W-CDMA, and the RF switching circuit is a switching duplexer for the GSM.

BRIEF DESCRIPTION OF THE DRAWINGS

The above and other objectives and features of the present invention will become more apparent from the following description of a preferred embodiment thereof with reference to accompanying drawings, throughout which like parts are designated by like reference numerals.

DETAILED DESCRIPTION OF THE PREFERRED EMBODIMENTS

This application is based on application Nos. 11-299685 and 2000-302071 filed in Japan, the content of which is incorporated herein by reference.

Now an embodiment of the multilayered ceramic RF device of the present invention will be described below with reference to FIG. 1 through FIG. 5.

Figure 1:
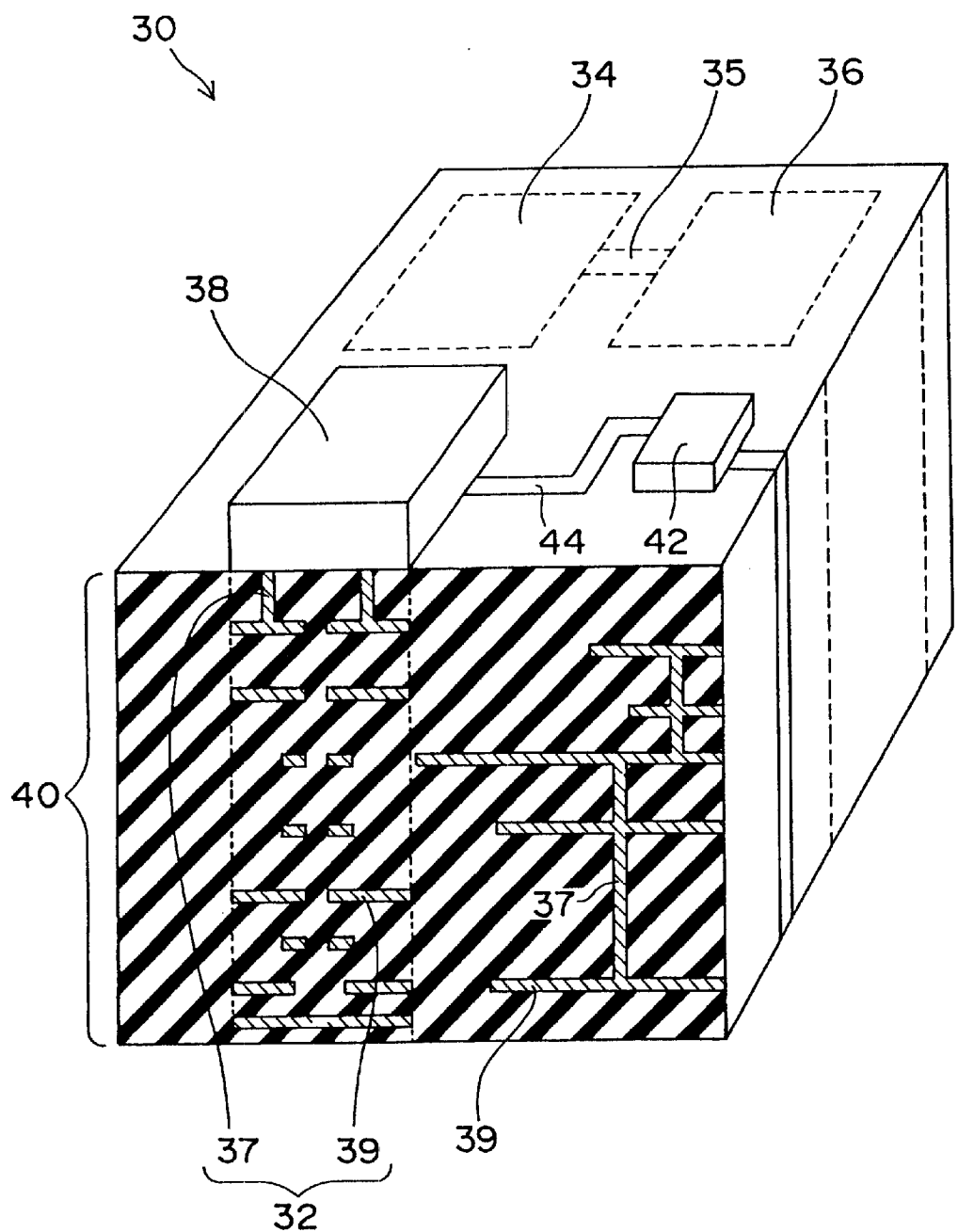
FIG. 1 is a perspective view of a multilayered ceramic RF device of the present invention.

FIG. 1 is a perspective view of a multilayered ceramic RF device 30 of the present invention. FIG. 1 also shows a partial cross section of the multilayered ceramic RF device 30. The multilayered ceramic RF device 30 shown in FIG. 1 includes a low temperature-cofired multilayered ceramic body 40, while first through third radio frequency filters 32, 34 and 36 are formed in the low temperature-cofired multilayered ceramic body 40. The low temperature-cofired multilayered ceramic body 40 also includes a fourth radio frequency filter (SAW filter) 38 mounted on the top surface thereof The low temperature-cofired multilayered ceramic body 40 further includes a bare semiconductor chip 42 mounted with a face down bonding (an electrode surface of the bare semiconductor chip 42 opposes the low temperature-cofired multilayered ceramic body 40) and is covered with a sealing resin on the upper surface thereof.

The low temperature-cofired multilayered ceramic body 40 is made by laminating a plurality of ceramic layers, a predetermined number of the plurality of ceramic layers having respective electrode patterns each formed on at least one surface thereof, and firing the layers together, as will be described later with reference to FIG. 5. This results in the electrode patterns 39 being formed on the surface and inside of the low temperature-cofired multilayered ceramic body 40. While the electrode pattern 39 is not shown on the surface of the low temperature-cofired multilayered ceramic body 40 in FIG. 1, the electrode pattern 39 is formed on the surface of the low temperature-cofired multilayered ceramic body 40 below the SAW filter 38. The SAW filter 38 and the multilayered filter 32 are electrically connected with each other as described later with reference to FIG. 2 through FIG. 4.

Electrical connection between the electrode patterns 39 formed in the low temperature-cofired multilayered ceramic body 40 and the connection between the electrode pattern 39 formed in the multilayered ceramic body 40 and the electrode pattern 39 formed on the surface of the multilayered ceramic body 40 are made through via holes 37. The via hole 37 is a hole which penetrates the ceramic layers included in the low temperature-cofired multilayered ceramic body 40 and is filled with, for example, Ag or Cu. Among the radio frequency filters included in the multilayered ceramic RF device 30, the first through third radio frequency filters 32, 34 and 36 are multilayered filters formed inside of the low temperature-cofired multilayered ceramic body 40 while each of the filters includes a part of the electrode patterns 39.

The bare semiconductor chip 42 that is mounted with a face down bonding on the surface of the low temperature-cofired multilayered ceramic body 40 is electrically connected to the radio frequency filter 38 via a micro strip line 44 formed on the surface of the multilayered ceramic body 40.

When the multilayered ceramic RF device 30 shown in FIG. 1 is used in a cellular telephone, the multilayered filter 32, the SAW filter 38 and the bare semiconductor chip 42 may constitute a receiving circuit included in the RF circuit, while the multilayered filters 34 and 36 may constitute a transmitting circuit included in the RF circuit.

In the multilayered ceramic RF device 30 shown in FIG. 1, as described above, the electrode pattern 39 formed on the surface of the low temperature-cofired multilayered ceramic body 40 and the electrode pattern 39 formed inside thereof are electrically connected with each other through the via hole 37. The first through third radio frequency filters 32, 34 and 36 are multilayered filters formed inside of the low temperature-cofired multilayered ceramic body 40 and the first through third radio frequency filters 32, 34 and 36 include a part of the electrode patterns 39. Accordingly, connection between the multilayered filters (34 and 36), or between the multilayered filter 32 and the other radio frequency filter 38 (SAW filter) can be achieved with very short wiring distances by using a strip line 35, the via holes 37 or the like formed inside of the multilayered ceramic body 40.

As a result, unmatched impedance and impedance loss can be decreased, ripple in the pass band of the radio frequency filter can be prevented and the proper performance of the filter can be realized, compared to the RF device of the prior art that has components such as the radio frequency filter and the multilayered filter individually mounted on the printed circuit board. Therefore, the multilayered ceramic RF device that has excellent high-frequency characteristics and high reliability can be provided.

The bare semiconductor chip 42 that is, for example, a transistor for a low-noise amplifier is mounted with a face down bonding on the top surface of low temperature-cofired multilayered ceramic body 40 and is electrically connected to the radio frequency filter 38 by means of the micro strip line 44 formed on the surface of the multilayered ceramic body 40. With this constitution, unmatched impedance and impedance loss in the wiring junction can be made smaller and ripple in the pass band of the radio frequency filter 38 can be mitigated.

A circuit that includes the bare semiconductor chip such as a low-noise amplifier circuit requires components having various functions such as a capacitor and an inductor. Since such components having various functions can be formed integrally formed inside and on the surface of the multilayered ceramic body 40, the multilayered ceramic RF device having excellent reproducibility and excellent high-frequency characteristics can be provided. Further, devices such as a cellular telephone can be made smaller in size and in profile. Also the number of components can be reduced and the manufacturing process can be simplified.

As will be described in detail later with reference to FIG. 12, the multilayered ceramic RF device 30 may also be made in such a configuration as a cavity. A metal cap for hermetically sealing the cavity is provided on the top surface of the multilayered ceramic body 40, with the bare semiconductor chip 42 or the SAW filter 38 being mounted at a bottom, of the cavity. Since this configuration makes it possible to form the bare semiconductor chip 42 or the SAW filter 38 inside the multilayered ceramic body 40, an even smaller multilayered ceramic RF device can be produced.

A case where the multilayered ceramic RF device 30 has four radio frequency filters has been described above. The multilayered ceramic RF device of the present invention, however, is not limited to this constitution and achieves effects similar to those described above as long as at least one radio frequency filter is provided and the radio frequency filter is a multilayered filter that is formed inside of the multilayered ceramic body. Also the bare semiconductor chip 42 and the SAW filter 38 may be provided as required.

To connect the bare semiconductor chip with the multilayered filter, the bare semiconductor chip may be mounted on the surface of the multilayered filter. At this time, if the area of the electrode patterns included in the multilayered filter is substantially equal to the sectional area of the bare semiconductor chip (area of the section perpendicular to the laminating direction of the ceramic layers included in the multilayered filter) and the bare semiconductor chip is disposed so as to overlap the multilayered filter, the bare semiconductor chip and the multilayered filter can be connected with the shortest wiring length. Thus, it is possible to further reduce the size of the multilayered ceramic RF device.

Now the multilayered filter 32 included in the multilayered ceramic body 40 of the multilayered ceramic RF device 30 shown in FIG. 1 will be described in detail below. While the description relates to the multilayered filter 32 included in the multilayered ceramic body 40, the same applies also to the multilayered filters 34 and 36.

Figure 2:
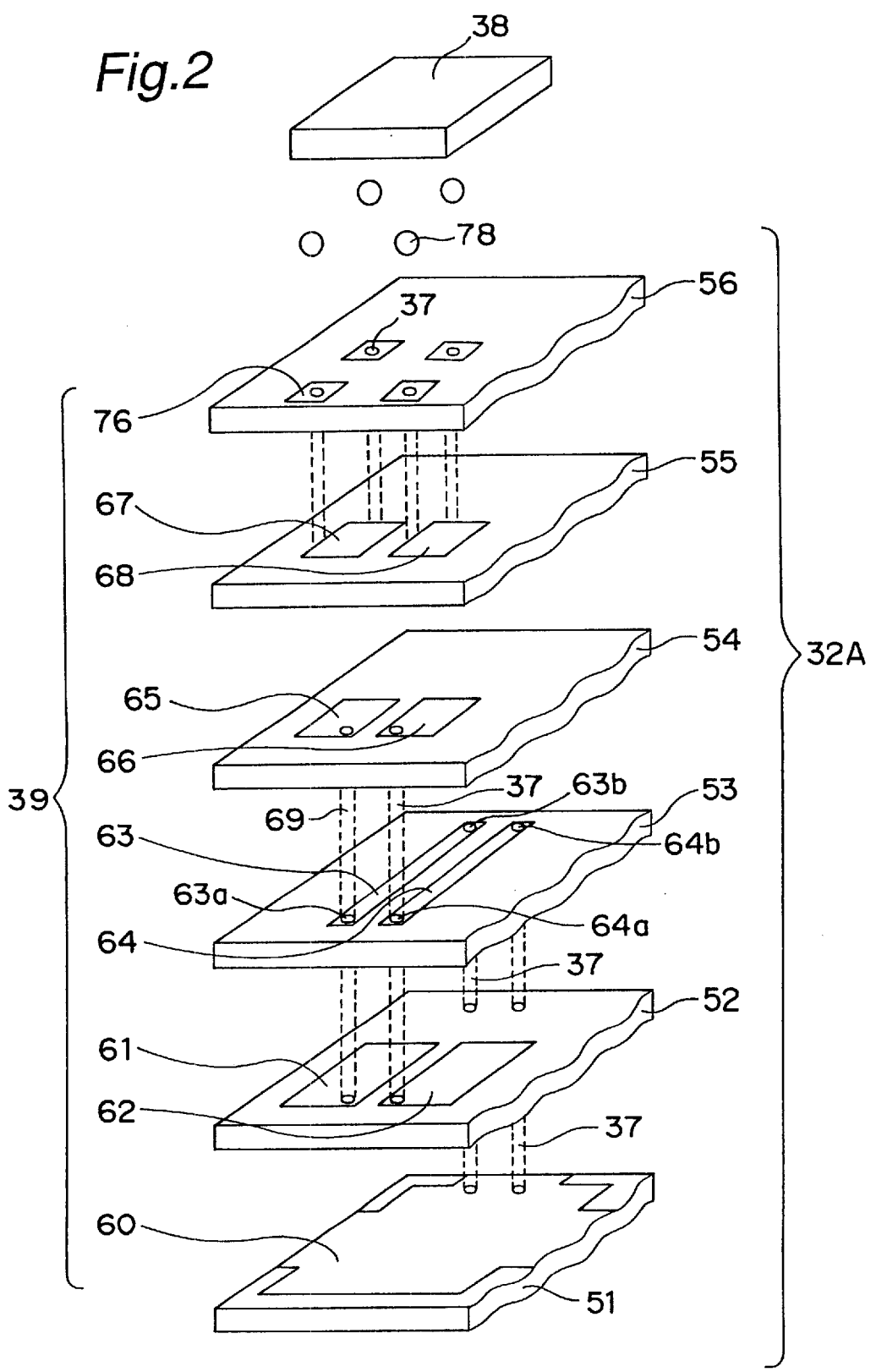
FIG. 2 is an exploded perspective view of a lumped constant multilayered filter.

The multilayered filter 32 may be either a lumped constant multilayered filter or a distributed constant multilayered filter. First, a case where the multilayered filter 32 is a lumped constant multilayered filter 32A will be described below with reference to FIG. 2. FIG. 2 is an exploded perspective view of the lumped constant multilayered filter 32A.

If the lumped constant multilayered filter 32A is used for the multilayered filter 32, the lumped constant multilayered filter 32A includes the capacitors and the inductors formed inside of the multilayered ceramic body 40, while the capacitor electrodes and the inductor electrodes are formed as a part of the electrode pattern 39 formed on the surface and inside of the multilayered ceramic body 40. The electrode patterns 39 included in the lumped constant multilayered filter 32A are capacitor electrodes 60 through 62 and 65 through 68, inductor electrodes 63, 64 and connecting land pattern 76 shown in FIG. 2. The capacitor electrode 60 serves also as an internal grounding electrode, as will be described later. These electrode patterns are electrically connected by means of the via holes 37. The lumped constant multilayered filter 32A will be described in more detail below.

As shown in FIG. 2, the lumped constant multilayered filter 32A has a plurality of dielectric layers (ceramic layers) 51 through 56, with the dielectric layers 51, 52, 53, 54, 55 and 56 laminated in this order. In the multilayered ceramic body 40, required area to be occupied by the lumped constant multilayered filter 32A is, for example, 3.0 mm×3.0 mm and thickness required of the lumped constant multilayered filter 32A is, for example, 0.8 mm. The SAW filter 38 is connected to the lumped constant multilayered filter 32A as described above.

As shown in FIG. 2, the lumped constant multilayered filter 32A has a plurality of dielectric layers (ceramic layers) 51 through 56, with the dielectric layers 51, 52, 53, 54, 55 and 56 are laminated in this order. In the multilayered ceramic body 40, required area to be occupied by the lumped constant multilayered filter 32A is, for example, 3.0 mm×3.0 mm and thickness required of the lumped constant multilayered filter 32A is, for example, 0.8 mm. The SAW filter 38 is connected to the lumped constant multilayered filter 32A such as described above.

A dielectric layer. 51 has the internal grounding electrode 60 formed therein, while the capacitor electrodes 61 and 62 are formed on the dielectric layer 52. The dielectric layer 53 has inductor electrodes (strip lines) 63 and 64 formed thereon. A dielectric layer 54 has the capacitor electrodes 65 and 66 formed thereon, while the capacitor electrodes 67 and 68 are formed on the dielectric layer 55.

The via holes 37 that penetrate the dielectric layer 56 are provided in the dielectric layer 56 over the capacitor electrodes 67 and 68 of the dielectric layer 55. Connecting land patterns 76 are formed around the via holes 37 in the surface of the dielectric layer 56. The SAW filter 38 having connection bumps 78 is mounted on the surface of the dielectric layer 56 so that the connection bumps 78 couple with the connecting land patterns 76. The capacitor electrodes 67 and 68 of the dielectric layer 55 are connected with the SAW filter 38 through the via holes 37 or the like so that the SAW filter 38 is electrically connected to the multilayered filter 32A.

The capacitor electrode 65 provided on the dielectric layer 54 is connected to one end 63a of the inductor electrode 63 provided on the dielectric layer 53 and to the capacitor electrode 61 provided on the dielectric layer 52 through the via hole 37. Similarly, the capacitor electrode 66 provided on the dielectric layer 54 is connected to one end 64a of the inductor electrode 64 provided on the dielectric layer 53 and to the capacitor electrode 62 provided on the dielectric layer 52 through the via hole 37.

The other end 63b of the inductor electrode 63 is connected to the internal grounding electrode 60 provided on the dielectric layer 51 through the via hole 37. Similarly, the other end 64b of the inductor electrode 64 is connected to the internal grounding electrode 60 provided on the dielectric layer 51 through the via hole 37.

The operation of the multilayered filter 32A as described above will be described below with reference to FIG. 3.

Figure 3:
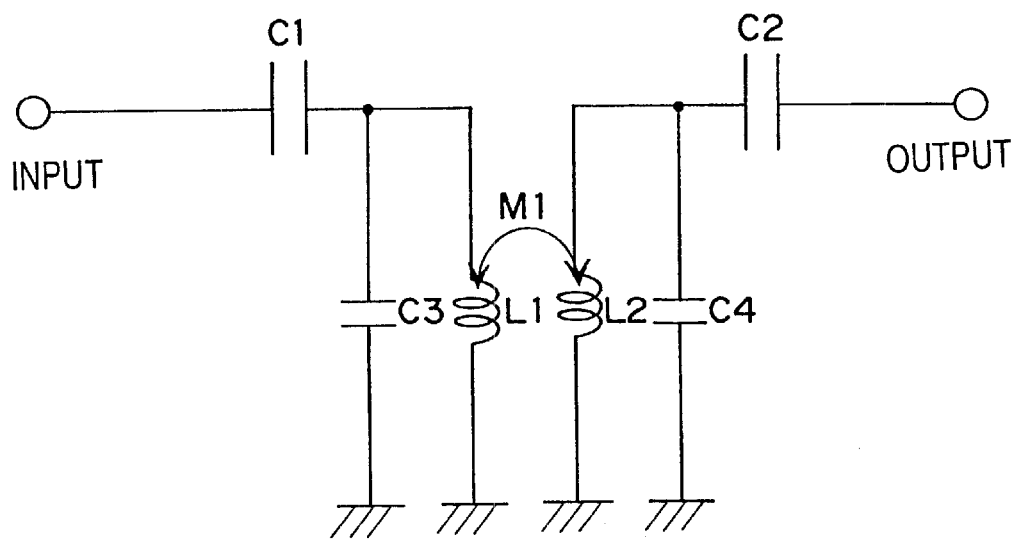
FIG. 3 is an equivalent circuit of the multilayered filter shown in FIG. 2.

FIG. 3 shows an equivalent circuit of the multilayered filter 32A shown in FIG. 2. A capacitor C1 in FIG. 3 corresponds to the capacitor formed from the capacitor electrode 67 and the capacitor electrode 65 shown in FIG. 2, and a capacitor C2 corresponds to the capacitor formed from the capacitor electrode 68 and the capacitor electrode 66. A capacitor C3 in FIG. 3 corresponds to the capacitor including the capacitor electrode 61 and the internal grounding electrode 60, and a capacitor C4 corresponds to the capacitor including the capacitor electrode 62 and the internal grounding electrode 60. Inductors L1 and L2 are formed from the inductor electrodes 63 and 64, respectively. One end (capacitor electrode 67) of the capacitor C1 is connected to an input electrode, and one end (capacitor electrode 68) of the capacitor C2 is connected to an output electrode.

Connected between the other end (capacitor electrode 65) of the capacitor C1 and the grounding electrode 60 are the inductor L1 and the capacitor C3 that are parallel to each other. Also connected between the other end (capacitor electrode 66) of the capacitor C2 and the grounding electrode 60 are the inductor L2 and the capacitor C4 that are parallel to each other. The Inductor L1 and the inductor L2 are provided near each other so as to establish electrode coupling. This configuration forms a 2-stage band-pass filter. Specifically, the inductor electrodes 63, 64 formed on the dielectric layer 53 are disposed symmetrically with respect to the center line on the surface of the dielectric layer 53 with the same length and width, and the distance between the inductor electrodes 63 and 64 is set so as to make the mutual inductance MI between the inductors L1 and L2 equal to a predetermined value. Such a configuration makes it possible to eliminate capacitive elements between resonators that have been required in the prior art, so that the multilayered filter can be made lower in profile.

Figure 4:
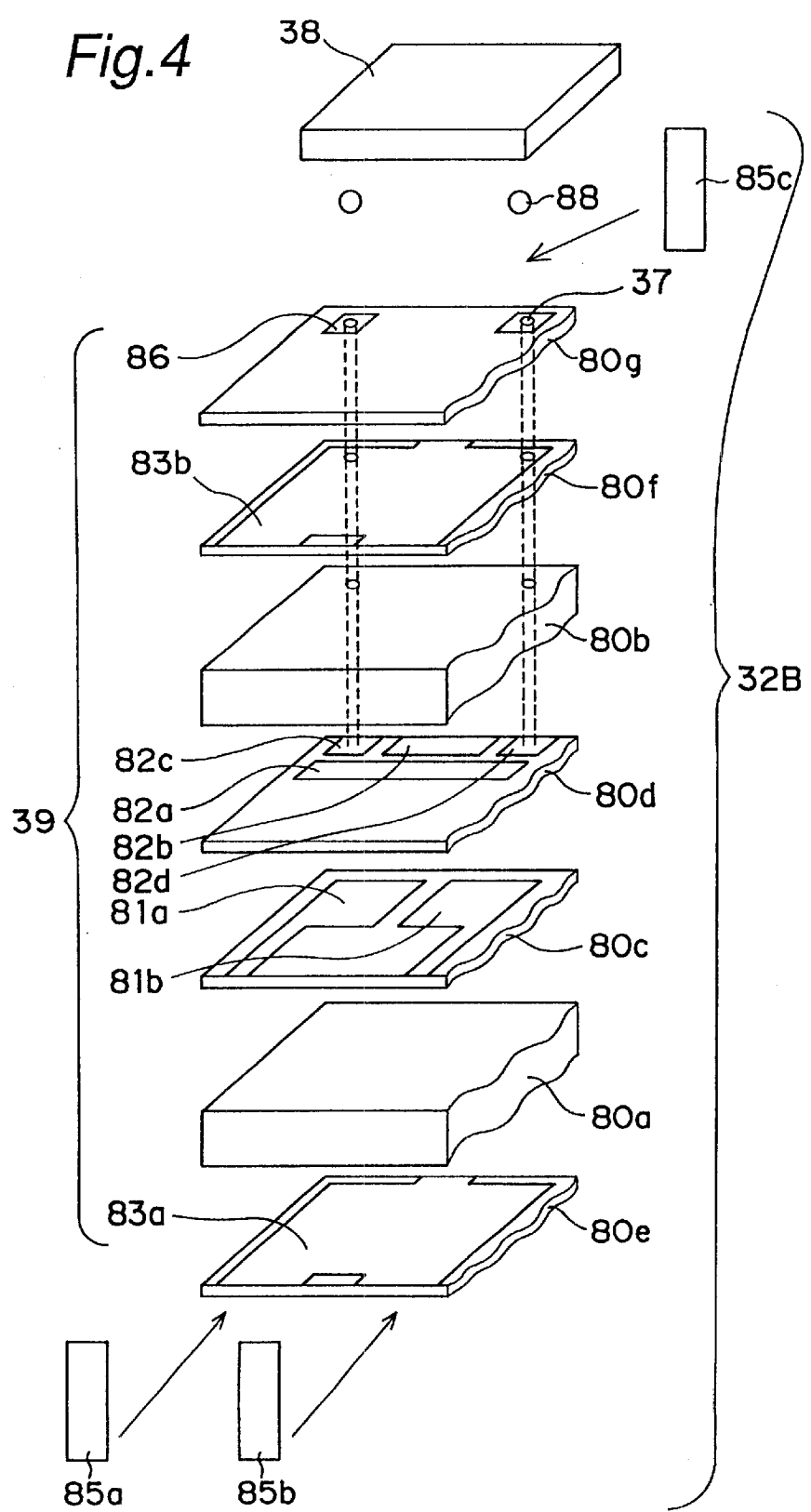
FIG. 4 is an exploded perspective view of a distributed constant multilayered filter.

Now a case of using a distributed constant multilayered filter 32B for the multilayered filter 32 will be described below with reference to FIG. 4. FIG. 4 is an exploded perspective view of the distributed constant multilayered filter 32B. When the-distributed constant multilayered filter 32B having a strip line resonator is used for the multilayered filter 32, the strip line resonator includes strip line resonator electrodes 81a and 81b that comprise a part of the electrode patterns 39 formed on the surface and inside of the multilayered ceramic body 40. Also a second electrode 82a, a third electrode 82b, fourth electrodes 82c, 82d, shield electrodes 83a, 83b and connecting land pattern 86 that are included in the distributed constant multilayered filter 32B also comprise a part of the electrode patterns 39 formed on the surface and inside of the multilayered ceramic body 40. These electrode patterns are electrically connected by means of the via holes 37. The distributed constant multilayered filter 32B will be described below in more detail.

Described below is a case where thick dielectric layers (ceramic layers) 80a and 80b and thin dielectric sheets (ceramic layers) 80c, 80d, 80e, 80f and 80g are used for the distributed constant multilayered filter 32B. The strip line resonator electrodes 81a and 81b are formed on the dielectric sheet 80c. Formed on the dielectric sheet 80d are the second electrode 82a, the third electrode 82b and the fourth electrodes 82c and 82d of a parallel plane capacitor. The SAW filter 38 is connected to the multilayered filter 32B.

The strip line resonator is made small in size by decreasing the width of the strip line midway on the side of a short-circuiting end and forming stepwise impedance. Also formed on the dielectric sheet 80e is the shield electrode 83a and formed on the dielectric sheet 80f is the shield electrode 83b.

The via holes 37 are formed to penetrate the dielectric layer 80b and the dielectric sheets 80f and 80g over the fourth electrodes 82c and 82d of the dielectric sheet 80d. The connecting land patterns 86 are formed around the via holes 37 on the dielectric sheet 80g. The SAW filter 38 that has the connection bumps 88 is mounted on the surface of the dielectric sheet 80g so that the connection bumps 88 couple with the connecting land patterns 86.

The dielectric sheet 80g that protects the electrode, the dielectric layers 80a and 80b and the dielectric sheets 80c, 80d, 80e and 80f are all stacked one on another thereby to form the overall multilayered structure.

Now the operation of the multilayered filter 32B having the above constitution will be described below.

The strip line resonator electrodes 81a, 81b and the second, third and fourth electrodes 82a, 82b, 82c and 82d that are disposed to oppose the strip line resonator electrodes form parallel plane capacitors in between. The second electrode 82a of the parallel plane capacitor serves as an inter-stage coupling capacitor, the third electrode 82b serves as a parallel capacitor that decreases the resonance frequency of the strip line resonator, and the fourth electrodes 82c and 82d serve as input-output coupling capacitor. The fourth electrodes 82c and 82d are connected to the SAW filter 38 through the via holes 37, as described above, and are used as input terminal and output terminal, respectively. The shield electrode 83b is connected to the side electrode 85c, the shield electrode 83a is connected to the side electrodes 85a, 85b and are used as grounding terminals.

In the multilayered filter 32B, the strip line resonator electrodes 81a and 81b also serve as the first electrode of the parallel plane capacitor. Since all the strip line resonator electrodes are printed on the dielectric sheet 80c and all the capacitor electrodes are printed on the dielectric sheet 80d, it suffices to print the electrodes only on two dielectric sheets 80c, 80d and two shield electrodes 83a, 83b. As a result, the number of printing steps can be reduced and the variations in the filter characteristics can be suppressed.

Now an example of the method of producing the multilayered ceramic RF device 30 will be described below with reference to FIG. 5. FIG. 5 is a flow chart of the method of producing the multilayered ceramic RF device 30.

Figure 5:
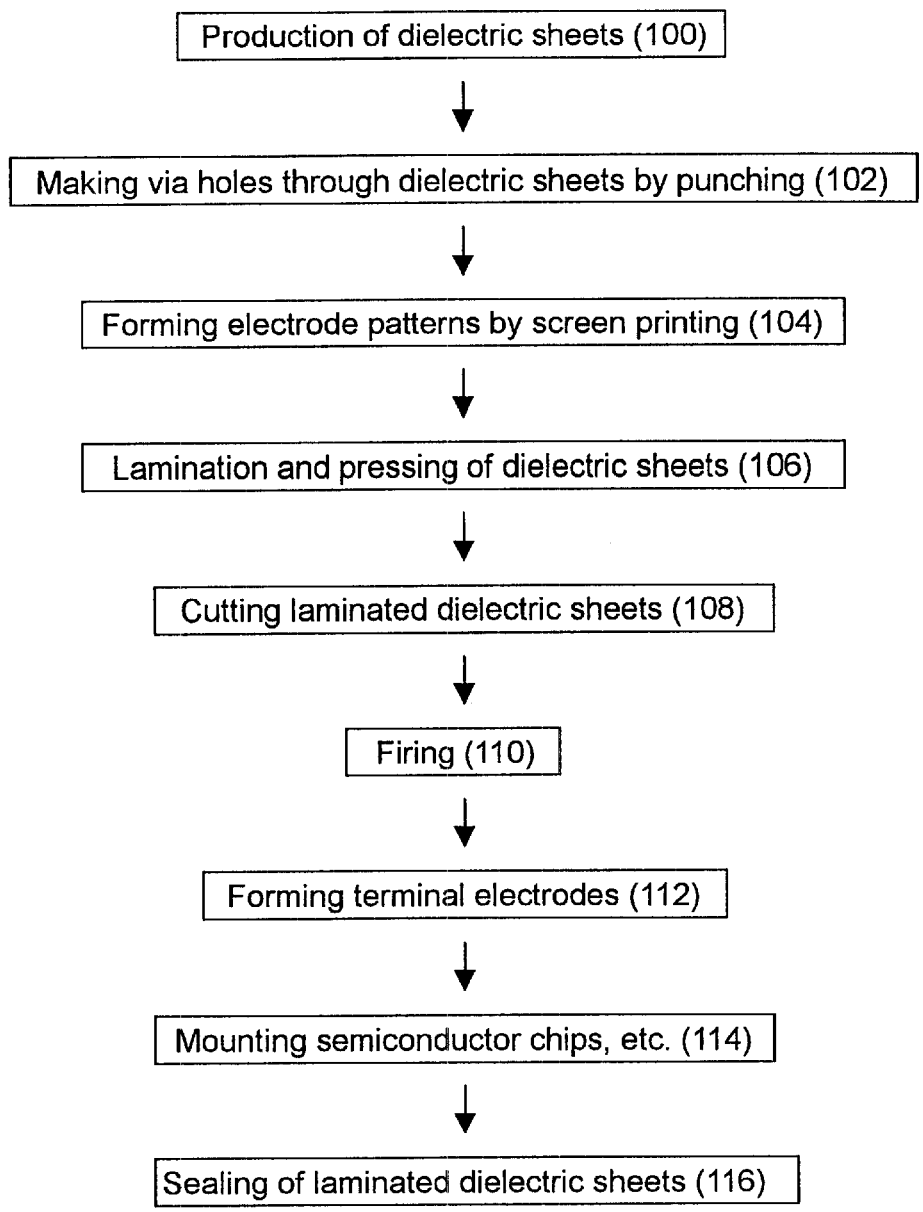
FIG. 5 is a flow chart showing a method of producing the multilayered ceramic RF device.

First, dielectric sheets (ceramic layers) are made by using AMSG (Al—Mg—Si—Gd—O ceramic material having a low dielectric constant of 7.5) (step 100 in FIG. 5). Then via holes are made in the dielectric sheets by punching, and the via holes are filled with a Cu paste (step 102). The via holes may also be made by laser machining. The via holes may be filled with an Ag paste.

Then, the electrode patterns are formed on the dielectric sheets by a screen printing process (step 104). The dielectric sheets thus obtained are laminated and pressed (step 106). The laminated dielectric sheets are cut to a proper size (step 108) and fired at about 950° C. (step 110). This firing temperature is lower than the cofiring temperature (1500° C. to 1600° C.) for ordinary ceramic substrates. This is because materials having low melting points such as Au, Ag and Cu are used for the conductor to form the electrode patterns. By using such materials as Au, Ag and Cu for the electrode, resistance of the electrode can be made lower and the high-frequency characteristics can be made better.

Terminal electrodes are formed on the laminated dielectric sheets (multilayered ceramic body) thus obtained (step 112), and a semiconductor chip or the like is mounted (step 114). Finally, the laminated dielectric sheets are sealed thereby to complete the multilayered ceramic RF device.

While the above description is a case where the dielectric sheet made of AMSG is used, a dielectric sheet (relative dielectric constant of 7) formed from a crystal phase made of $Mg_2SiO_4$ and a glass phase made of Si—Ba—La—B—O may also be used. Further, a dielectric sheet formed from BCN (Bi—Ca—Nb—O high dielectric constant ceramic material having relative dielectric constant of 58) may also be used.

The multilayered ceramic body may also include laminated dielectric layers, each of which has a different value of relative dielectric constant. In order to form a capacitor of large capacitance in the multilayered ceramic body, a thin dielectric sheet having a high dielectric constant may be used. In order to form an inductor in the multilayered ceramic body, a dielectric material having a low dielectric constant and excellent temperature characteristics may be used. When dielectric sheets having different values of relative dielectric constant are laminated and fired to form a multilayered ceramic body, however, warp is likely to occur due to the difference in the thermal expansion coefficient. Therefore, when the dielectric sheets of different materials are used to form the multilayered ceramic body, for example, it is preferable to form the multilayered ceramic body from a first ceramic layer having a first relative dielectric constant sandwiched by two second ceramic layers having a second relative dielectric constant (the second relative dielectric constant being less than the first relative dielectric constant, or the second relative dielectric constant being greater than the first relative dielectric constant), and to dispose the ceramic layers in a configuration so that the order of stacking the ceramic layers is symmetrical with respect to the laminating direction (refer to, for example, FIG. 11 to be described later).

Figure 6:
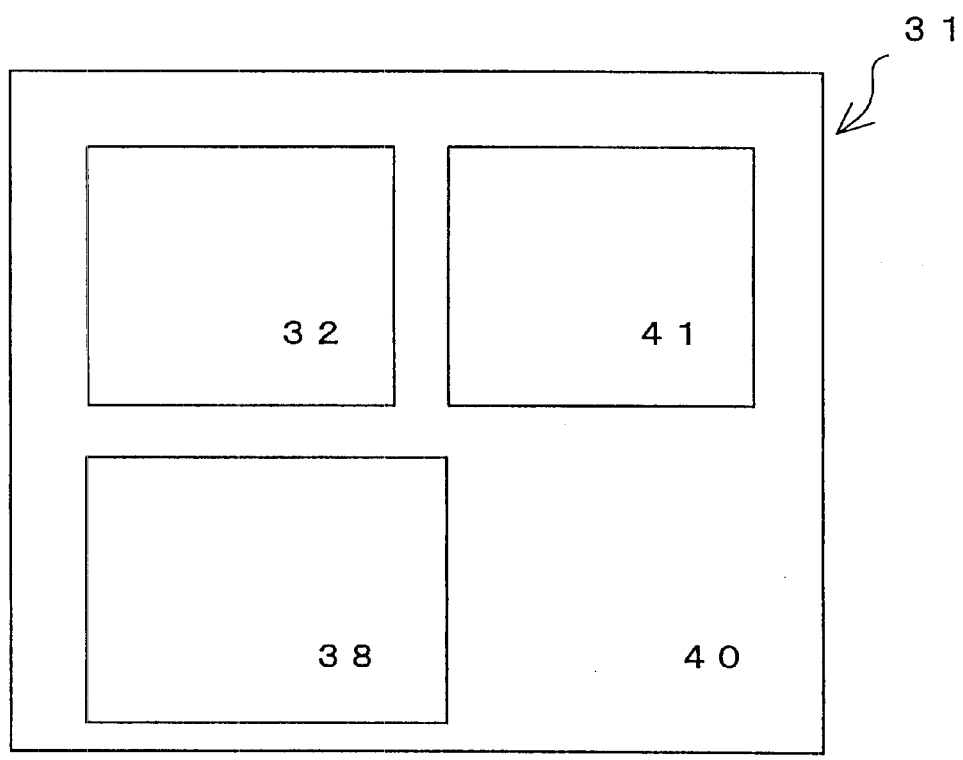
FIG. 6 is a block diagram of a multilayer RF device including a switching circuit.

The multilayered ceramic RF device 30 of the present invention can include, in addition to the multilayered filter 32 as described above, a switching circuit as well. The multilayered ceramic RF device that includes the switching circuit will be described below with reference to FIG. 6. FIG. 6 is a block diagram of the mutilayered ceramic RF device 31 that includes the switching circuit.

Figure 17:
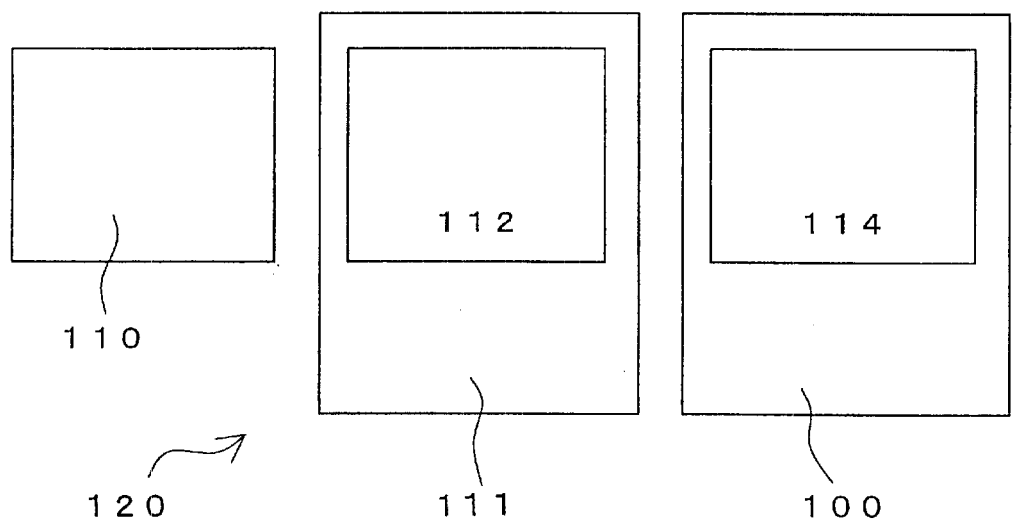
FIG. 17 is a block diagram schematically showing an example of the constitution of a RF device of the prior art.

The mutilayered ceramic RF device 31 shown in FIG. 6 has the multilayered filter 32, an RF switching circuit 41 and the SAW filter 38 being formed in the multilayered ceramic body 40 that is integrated. In the prior art, because there was not the idea of forming the components in the multilayered ceramic body 40 that is integrated, the conventional RF devices had to be made individually by forming the multilayered filter, the RF switch, and the SAW filter as separate devices (refer to FIG. 17) and then mounting these components separately on a mother board while making electrical connection therebetween by using lines.

The multilayered ceramic RF device 31 is considered to be best applied to, for example, an ultra small antenna duplexer for GSM/IMT-2000 (international mobile telecommunication 2000) dual-mode cellular telephone (for example, W-CDMA). Low loss and power durability in 2 GHz band of the multilayered filter 32 are favorable characteristics for the transmission filter of the IMT-2000 system. Sharp filtering characteristics of the SAW filter 38 are favorable for the transmitting filter of the IMT-2000 system. The RF switch 41 has characteristics that are favorable for the duplexer for GSM in which transmitting and receiving are carried out by time division operation since the GSM is a TDMA (time division multiple access) system. The multilayered filter 32 and the SAW filter 38 are combined to constitute a duplexer for the IMT-2000 system and, when combined with a duplexer that can be formed in the multilayered ceramic body 40, can constitute an ultra small dual-mode duplexer.

The duplexer can have poor high-frequency characteristics unless the filters and the switches are connected with proper impedance matching. Thus integrating these components to ensure the characteristics provides a remarkable merit for the assembly of cellular telephones.

The multilayered ceramic RF device constituted as described above has remarkable effects of achieving multiple functions and high performance operation with a single ultra compact multilayered ceramic body.

Figure 7:
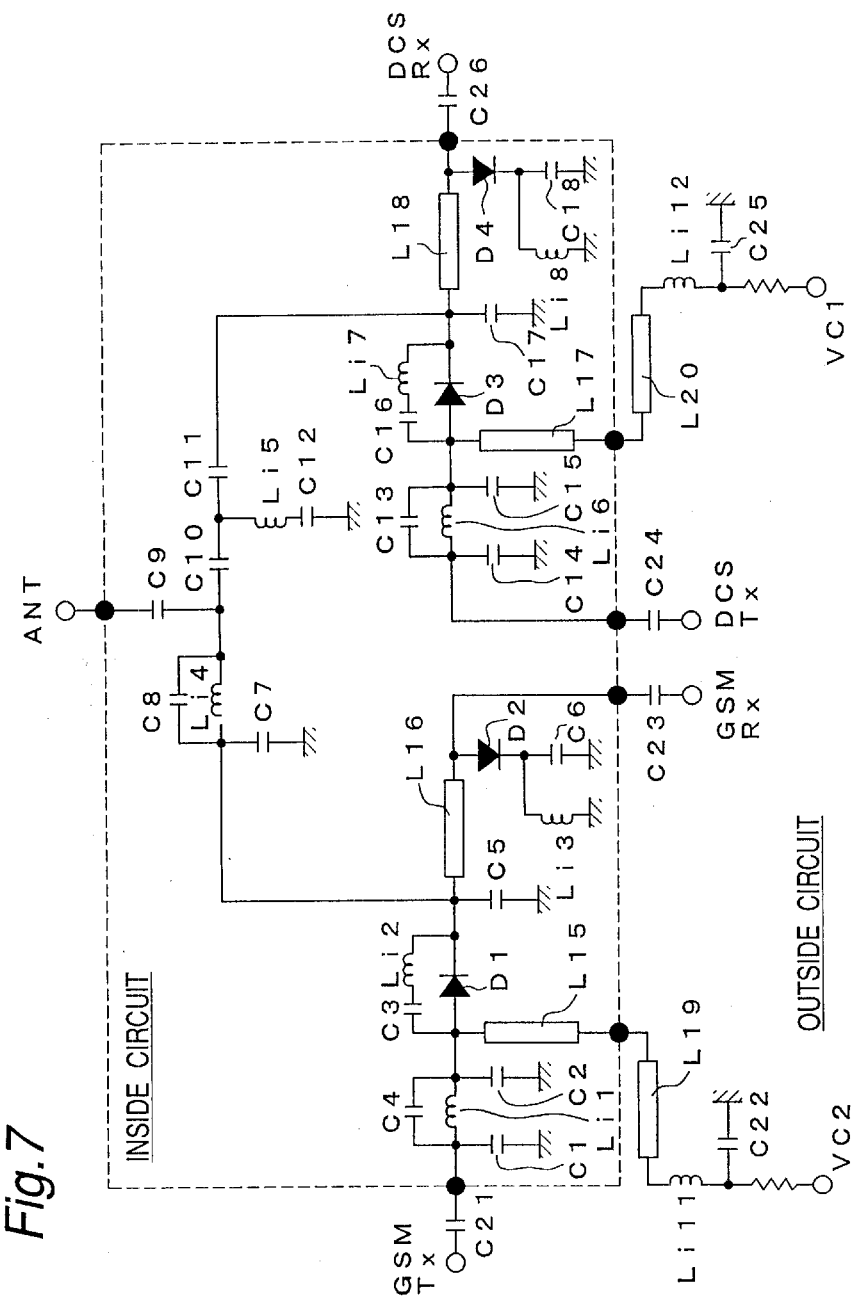
FIG. 7 shows an example of an RF switching circuit.

An example of the RF switching circuit 41 is shown in FIG. 7. The RF switching circuit 41 includes, for example, capacitor electrodes C1 through C18 and C21 through C26, inductor electrodes Li1 through Li8, Li11 and Li12, diodes D1 through D4 and distributed constant lines L15 through L20, as shown in FIG. 7. The capacitor electrodes C1 through C18, the inductor electrodes Li1 through Li8 and the distributed constant lines L15 through L18 are constituted from a part of the electrode patterns formed inside of the multilayered ceramic body 40. The diodes D1 through D4 are mounted on the surface of the multilayered ceramic body 40, while the capacitor electrodes C21 through C26, inductor electrodes Li11 and Li12, and the distributed constant lines L19 and L20 are provided outside the multilayered ceramic body 40. The RF switching circuit 41 may also be formed by using transistors, either instead of the diodes or in combination with the diodes. The RF switching circuit 41 may also be formed in various constitutions, without being limited to the circuit shown in FIG. 7.

Now variations of the multilayered ceramic RF device of the present invention will be described below as the first through seventh preferred embodiments. It should be noted, although not explicitly described, that at least one multilayered filter is incorporated in the multilayered ceramic body 1 included in the multilayered ceramic RF device of the first through seventh preferred embodiments. The multilayered filter incorporated in the multilayered ceramic body 1 is formed while including a part of the electrode patterns 2 formed on the surface and inside of the multilayered ceramic body, as described previously.

Embodiment 1

Figure 8:
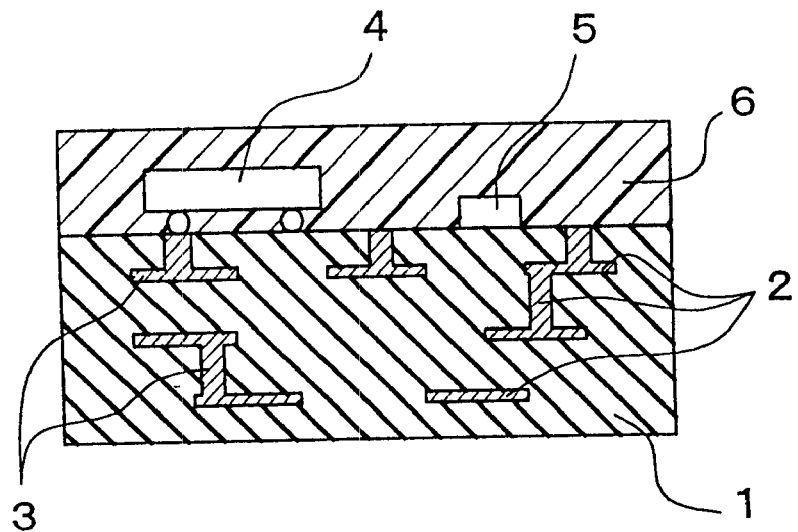
FIG. 8 is a sectional view of a multilayered ceramic RF device according to a first embodiment of the present invention.

FIG. 8 is a sectional view of the multilayered ceramic RF device of the first embodiment. In FIG. 8, reference numeral 1 denotes a low temperature-cofired multilayered ceramic body, 2 denotes an electrode pattern, 3 denotes a via hole, 4 denotes a bare semiconductor chip, 5 denotes a chip component and 6 denotes a sealing resin.

The operation of the multilayered ceramic RF device having the constitution as described above will be described below with reference to FIG. 8.

The electrode patterns 2 form inner layer capacitors and inner layer inductors in the low temperature-cofired multilayered ceramic body 1, as well as providing electrical connection of a plurality of chip components 5 with each other. The chip components 5 include chip resistors, chip capacitors, chip inductors and packaged semiconductors that may be occasionally used. The multiple layer electrode patterns formed in the low temperature-cofired multilayered ceramic body that is laminated and fired together are made of copper or silver. The electrode patterns are electrically connected by arranging via holes at desired positions in the ceramic layers. The electrode patterns formed on the plurality of ceramic layers are formed by a screen printing process or the like, and the via holes are formed by making holes in the dielectric sheet by a puncher and filling the holes with a conductive paste by printing or another method. The ceramic body has side electrodes formed on the side faces thereof for the connection with the outside, although not shown in the drawing. These components collectively constitute the RF circuit and achieve the functions of the multilayered ceramic RF device that includes, for example, the mutilayered RF switches.

A major difference between this constitution and the prior art is that the bare semiconductor chips which operate at a frequency not lower than the UHF band are mounted face down on the top surface of the ceramic body, and that the top surface of the ceramic body is coated with a sealing resin to cover the bare chip. The bare semiconductor chip includes bipolar transistor, FET, diode and IC, and is made from a compound semiconductor of silicon or the like. The bare semiconductor chip is mounted face down by, for example, bump connection technique such as stud bump bonding (SBB) or the like.

At frequencies not lower than 300 MHz, the so-called UHF band, packaged semiconductors generally have parasitic impedance due to the lead wire and molding resin that are characteristic to the packaging construction. Thus, they are unable to fully achieve the characteristic performance which the semiconductor originally has at the high frequencies. As a result, problems result such as a decrease in gain, increase in frequency deviation and deteriorated noise characteristic. There is also such a drawback that impedance matching requires many external components, thus leading to an increasing number of components and larger size of the circuit.

In the constitution of this embodiment, on the other hand, the semiconductor can be used in the form of a bare chip, and is not subject to the parasitic impedance which is caused by the lead wire and molding resin characteristic to the packaging construction. As to mounting of the components, parasitic impedance is minimized by the face down mounting by means of the bump connection, thus achieving excellent high frequency characteristics. Specifically, higher gain, reduction of frequency deviation and better noise characteristic can be achieved. Moreover, since the package size can be ignored when mounting the bare chips, the area required for mounting the components can be decreased resulting in smaller device size. Also external components are made mostly unnecessary.

In order to protect the bare semiconductor chip, the entire top surface of the ceramic body is coated with the sealing resin in the constitution of this embodiment. While the bare semiconductor chip is generally protected by a thin insulating film such as silicon oxide or silicon nitride on the surface thereof, additional coating with the sealing resin improves the reliability further.

The additional coating of the top surface of the ceramic body with the sealing resin makes the top surface of the multilayered ceramic RF device flat. Thus it is made possible to make an SMD (surface mounted device) that can be automatically mounted by a mounter and can be very easily handled as a high-frequency component.

According to this embodiment, as described above, because the low temperature-cofired multilayered ceramic body is laminated and fired together has electrode patterns formed therein from copper or silver, the electrode patterns is electrically connected through via holes arranged at desired position in the ceramic layers, the bare semiconductor chip which operates at a frequency not lower than the UHF band is mounted face down on the top surface of the ceramic body and the top surface of the ceramic body is coated with a sealing resin to cover the bare chip, it is possible to produce a small device having excellent high-frequency characteristics and improved reliability. It is also possible to provide an SMD that can be handled easily and automatically mounted.

Embodiment 2

The second embodiment of the present invention will be described below with reference to FIG. 9.

Figure 9:
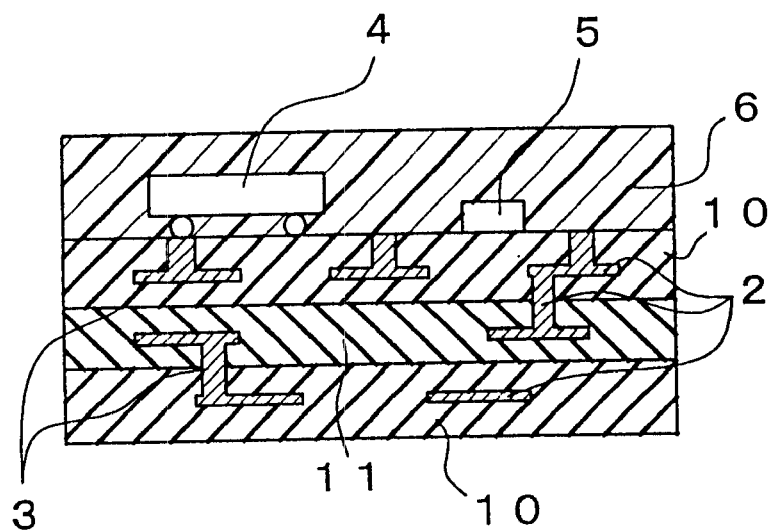
FIG. 9 is a sectional view of a multilayered ceramic RF device according to a second embodiment of the present invention.

FIG. 9 is a sectional view of the multilayered ceramic RF device of the second embodiment or the present invention. In FIG. 9, reference numeral 10 denotes a low dielectric constant, low temperature-cofired ceramic layer, 11 denotes a high dielectric constant, low temperature-cofired ceramic layer, 2 denotes an electrode pattern, 3 denotes a via hole, 4 denotes a bare semiconductor chip, 5 denotes a chip component and 6 denotes a sealing resin. This constitution differs from that shown in FIG. 8 in that the high dielectric constant, low temperature-cofired ceramic layer 11, instead of the low temperature-cofired multilayered ceramic body 1, is sandwiched by the low dielectric constant, low temperature-cofired ceramic layers 10.

The operation of the multilayered ceramic RF device having the constitution described above will be described below with reference to FIG. 9.

The electrode patterns 2 form inner layer capacitors and inner layer inductors in the low dielectric constant low temperature-cofired ceramic layer 10 and in the high dielectric constant low temperature-cofired ceramic layer 11, as well as providing electrical connection between a plurality of chip components 5. The chip components 5 include chip resistors, chip capacitors, chip inductors and packaged semiconductors that may be occasionally used. The bare semiconductor chip 4 and the like are also mounted on the top surface of the ceramic body. The electrode patterns formed in a heterogeneous lamination of low temperature-cofired ceramic body that is laminated and fired together are made of copper or silver, and are electrically connected by arranging via holes at desired positions in the ceramic layers. The ceramic body normally has side face terminal electrodes formed on the side faces thereof for the connection with the outside, although not shown in the drawing. These components collectively constitute the RF circuit and achieve the functions of the multilayered ceramic RF device that includes, for example, the mutilayered RF switches.

A major difference between this constitution and that of the first embodiment is that the high dielectric constant, low temperature-cofired ceramic layer 11, instead of the low temperature-cofired multilayered ceramic body 1, is sandwiched by the low dielectric constant, low temperature-cofired ceramic layers 10.

The length of a strip line resonator can be, in general, decreased in inverse proportion to the square root of the relative dielectric constant. Therefore, in case strip line electrodes formed in the high dielectric constant ceramic layer are used for the strip line resonator, wavelength in the dielectric layer can be decreased. Thus the high dielectric constant ceramic layer is suited to form a small strip line resonator. When a ceramic layer having small dielectric loss is used, a strip line resonator that has a high quality factor Q can be formed. However, strip lines have normally low characteristic impedance. For example, a strip line having a minimum line width of 100 $\mu$m and shield distance of 2 mm, that can be formed by screen printing, has characteristic impedance in a range from 20 to 30 ohms, and it is practically impossible to form a line of 50 ohms. Also the high relative dielectric constant makes it easy to make the inner layer capacitor of large capacitance with a small area.

As to the strip line formed in the low dielectric constant ceramics, while the wavelength cannot be decreased much, high characteristic impedance of 50 ohms or higher can be easily realized, and an inner layer inductor can also be easily formed. Because of the low relative dielectric constant, electromagnetic coupling between strip lines that are located near to each other is relatively weak, that is suited for forming electrode patterns.

As described above, by providing a heterogeneous junction of ceramic sheets having two or more different values of relative dielectric constant and by arranging optimum circuit components in the layers, small size and high performance can be achieved at the same time. Relative dielectric constant of the ceramic layer is preferably set, in consideration of the relationship with the characteristic impedance of the strip lines, below 10 for the top layer, 10 or higher and more preferably from about 40 to 60 for the intermediate layer, and below 10 for the bottom layer.

The reason for employing the structure of sandwiching the high dielectric constant, low temperature-cofired ceramic layer 11 by the low dielectric constant, low temperature-cofired ceramic layers 10 is for the purpose of preventing the ceramic body from warping during cofiring due to the difference in the thermal expansion coefficient, by making the structure vertically symmetrical with respect to the central horizontal plane.

According to this embodiment, as described above, the multilayered ceramic RF device that can achieve small size and high performance at the same time is provided, by employing the constitution of a heterogeneous ceramic multilayered structure including ceramic layers of different relativess dielectric constants. The heterogeneous laminated structure is formed from three or more ceramic layers of different relative dielectric constants, with the top layer being the low dielectric constant low temperature-cofired ceramic layer having relative dielectric constant below 10, the intermediate layer being the high dielectric constant, low temperature-cofired ceramic having relative dielectric constant of 10 or higher, and the bottom layer being the low dielectric constant low temperature-cofired ceramic layer having relative dielectric constant below 10.

Embodiment 3

Figure 10:
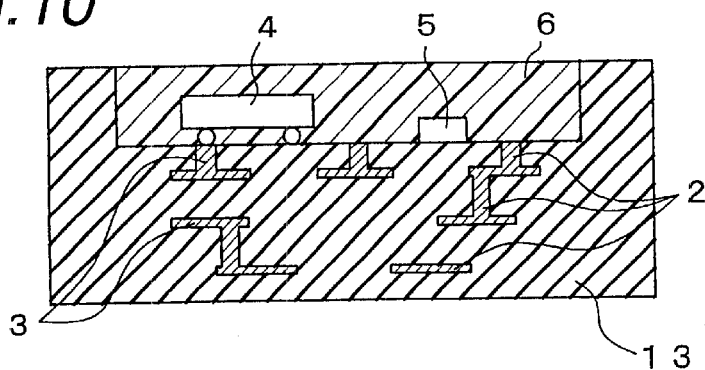
FIG. 10 is a sectional view of a multilayered ceramic RF device according to a third embodiment of the present invention.

FIG. 10 is a sectional view of the multilayered ceramic RF device of the third embodiment of the present invention. In FIG. 10, reference numeral 13 denotes a cavity type low temperature-cofired multilayered ceramic body, 2 denotes an electrode pattern, 3 denotes a via hole, 4 denotes a bare semiconductor chip, 5 denotes a chip component and 6 denotes a sealing resin. This constitution differs from that shown in FIG. 8 in that the low temperature-cofired multilayered ceramic body 1 is replaced with the cavity type low temperature-cofired multilayered ceramic body 13.

The operation of the multilayered ceramic RF device having the above constitution will be described below with reference to FIG. 10.

The electrode patterns 2 form inner layer capacitors and inner layer inductors in the cavity type low temperature-cofired multilayered ceramic body 13, as well as providing electrical connections between a plurality of chip components 5. The chip components 5 include chip resistors, chip capacitors, chip inductors and packaged semiconductors that may be occasionally used. The electrode patterns formed in the cavity type low temperature-cofired multilayered ceramic body (i.e., a ceramic body with a cavity formed therein) that is laminated and fired together are made of copper or silver, and the electrode patterns are electrically connected by arranging via holes at desired positions in the ceramic layers. The electrode patterns formed on the plurality of ceramic layers are formed by, for example, screen printing while the via holes are formed by making holes in the dielectric sheet by a puncher and filling the holes with a conductive paste by printing or the like. The cavities are also formed by making holes in the dielectric sheet by a puncher and filling the holes with a sealing resin. The ceramic body has side electrodes formed on the side faces thereof for the connection with the outside, although not shown in the drawing. These components collectively constitute the RF circuit and achieve the functions of the multilayered ceramic RF device that includes, for example, the mutilayered RF switches.

A major difference between this constitution and that of the first embodiment is that the low temperature-cofired multilayered ceramic body 1 is replaced with the cavity type low temperature-cofired multilayered ceramic body 13. The ceramic body having the cavity reduces the possibility of the sealing resin 6 spreading to the side faces. Therefore, a defect of production such as when the resin covers the side face terminal electrodes does not occur.

According to this embodiment, as described above, the ceramic body has a cavity formed at the middle of the top surface thereof By employing the structure having the cavity filled with the sealing resin, a multilayered ceramic RF device can be provided so that the possibility of the sealing resin spreading to the side faces is reduced and so that a defect of production that the side face terminal electrodes are covered by the resin does not occur.

Embodiment 4

The fourth embodiment of the present invention will be described below with reference to FIG. 11.

Figure 11:
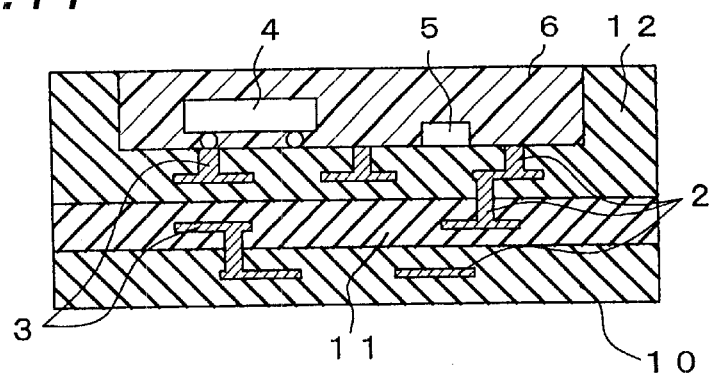
FIG. 11 is a sectional view of a multilayered ceramic RF device according to a fourth embodiment of the present invention.

FIG. 11 is a sectional view of the multilayered ceramic RF device of the fourth embodiment of the present invention. In FIG. 11, reference numeral 10 denotes a low dielectric constant, low temperature-cofired ceramic layer, 11 denotes a high dielectric constant, low temperature-cofired ceramic layer, 12 denotes a cavity type low dielectric constant, low temperature-cofired ceramic layer, 2 denotes an electrode pattern, 3 denotes a via hole, 4 denotes a bare semiconductor chip, 5 denotes a chip component and 6 denotes a sealing resin. This constitution differs from that shown in FIG. 10 in that the cavity type low temperature-cofired ceramic layer 13 is replaced by the structure having the cavity type low dielectric constant, low temperature-cofired ceramic layer 12 disposed as the top layer, the high dielectric constant, low temperature-cofired ceramic layer 11 disposed as the intermediate layer and the low dielectric constant, low temperature-cofired ceramic layer 10 disposed as the bottom layer.

The operation of the multilayered ceramic RF device having the above constitution will be described below with reference to FIG. 11.

The electrode patterns 2 form inner layer capacitors and inner layer inductors in the low dielectric constant, low temperature-cofired ceramic layer 10 and in the high dielectric constant, low temperature-cofired ceramic layer 11, as well as providing electrical connections between a plurality of chip components 5. The chip components 5 include chip resistors, chip capacitors, chip inductors and packaged semiconductors that may be occasionally used. The bare semiconductor chip 4 is mounted in the cavity formed on the top surface of the ceramic body. The electrode patterns formed in the heterogeneous low temperature-cofired multilayered ceramic body that is laminated and fired together are made of copper or silver, and the electrode patterns are electrically connected by arranging via holes at desired positions in the ceramic layers. The electrode patterns can also be formed in the cavity type low dielectric constant, low temperature-cofired ceramic layer 12 of the top layer, thereby making the device smaller. The ceramic body normally has side face terminal electrodes formed on the side faces thereof for the connection with the outside, although not shown in the drawing. These components collectively constitute the RF circuit and achieve the functions of the multilayered ceramic RF device that includes, for example, the mutilayered RF switches.

A major difference between this constitution and that of the third embodiment is that the cavity type low temperature-cofired multilayered ceramic body 13 is replaced by the heterogeneous multilayered structure having the cavity type low dielectric constant, low temperature-cofired ceramic layer 12 disposed as the top layer, the high dielectric constant, low temperature-cofired ceramic layer 11 disposed as the intermediate layer and the low dielectric constant, low temperature-cofired ceramic layer 10 disposed as the bottom layer.

The length of a strip line resonator can be, in general, decreased in inverse proportion to the square root of the relative dielectric constant. Therefore, in case strip line electrodes formed in the high dielectric constant ceramic layer are used for the strip line resonator, wavelength in the dielectric layer can be decreased. Thus the high dielectric constant ceramic layer is suited to form a small strip line resonator. When a ceramic layer having small dielectric loss is used, a strip line resonator that has a high quality factor Q can be formed. However, strip lines have normally low characteristic impedance. For example, a strip line having a minimum line width of 100 $\mu$m and shield distance of 2 mm, that can be formed by screen printing, has characteristic impedance in a range from 20 to 30 ohms, and it is practically impossible to form a line of 50 ohms. Also the high relative dielectric constant makes it easy to make the inner layer capacitor of large capacitance with a small area.

As to the strip line formed in the low dielectric constant ceramics, while the wavelength cannot be decreased much, high characteristic impedance of 50 ohms or higher can be easily realized, and an inner layer inductor can also be easily formed. Because of the low relative dielectric constant, electromagnetic coupling between strip lines that are located near to each other is relatively weak, that is suited for forming electrode patterns.

As described above, through the heterogeneous junction of the ceramic sheets having two or more different values of relative dielectric constant and by arranging optimum circuit components in the layers, small size and high performance can be achieved at the same time. Relative dielectric constant of the ceramic layer is preferably set, in consideration of the relationship with the characteristic impedance of the strip lines, below 10 for the top layer, 10 or higher and more preferably from about 40 to 60 for the intermediate layer, and below 10 for the bottom layer.

The reason for employing the structure of sandwiching the high dielectric constant, low temperature-cofired ceramic layer 11 by the cavity type low dielectric constant, low temperature-cofired ceramic layer 12 and the low dielectric constant, low temperature-cofired ceramic layer 10 is for the purpose of preventing the ceramic body from warping during cofiring due to the difference in the thermal expansion coefficient, by making the structure symmetrical with respect to the central horizontal plane.

According to this embodiment, as described above, the multilayered ceramic RF device that can achieve small size and high performance at the same time is provided, by employing the constitution of heterogeneous multilayered structure from ceramic layers of different relative dielectric constants. The heterogeneous multilayered structure is formed from three or more ceramic layers of different relative dielectric constants, with the top layer being the cavity type low dielectric constant, low temperature-cofired, ceramic layer having relative dielectric constant below 10, the intermediate layer being the high dielectric constant, low temperature-cofired ceramic layer having relative dielectric constant of 10 or higher, and the bottom layer being the low dielectric constant, low temperature-cofired ceramic layer having relative dielectric constant below 10.

Embodiment 5

Figure 12:
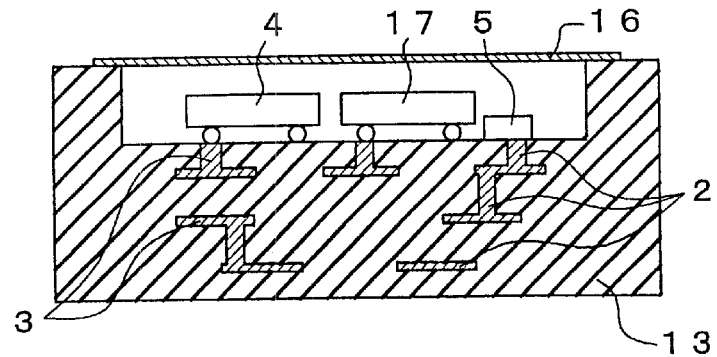
FIG. 12 is a sectional view of a multilayered ceramic RF device according to a fifth embodiment of the present invention.

FIG. 12 is a sectional view of the multilayered ceramic RF device of the fifth embodiment of the present invention. In FIG. 12, reference numeral 13 denotes a cavity type low temperature-cofired multilayered ceramic body, 2 denotes an electrode pattern, 3 denotes a via hole, 4 denotes a bare semiconductor chip, 5 denotes a chip component, 16 denotes a sealing metal cap and 17 denotes a SAW filter. This constitution differs from that shown in FIG. 10 in that, instead of filling the cavity with the sealing resin 6, the cavity space of the cavity type low temperature-cofired multilayered ceramic body 13 is hermetically sealed with the sealing metal cap 16.

The operation of the multilayered ceramic RF device having the above constitution will be described below with reference to FIG. 12.

The electrode patterns 2 form inner layer capacitors and inner layer inductors in the cavity type low temperature-cofired multilayered ceramic body 13, as well as providing electrical connections between a plurality of chip components 5. The chip components 5 include chip resistors, chip capacitors, chip inductors and packaged semiconductors that may be occasionally used. The electrode patterns formed in the cavity type low temperature-cofired multilayered ceramic body that is laminated and fired together are made of copper or silver, and the electrode patterns are electrically connected by arranging via holes at desired positions in the ceramic layers. The electrode patterns of the plurality of ceramic layers are formed by screen printing or the like, and the via holes are formed by making holes in the dielectric sheet by a puncher and filling the holes with a conductive paste by printing or other method. The cavities are also formed by making holes in the dielectric sheet by a puncher, with the cavity space being hermetically sealed with the sealing metal cap 16. The ceramic body has side face terminal electrodes formed on the side faces thereof for the connection with the outside, although not shown in the drawing. These components collectively constitute the RF circuit and achieve the functions of the multilayered ceramic RF device includes, for example, the mutilayered RF switches.

A major difference between this constitution and that of the first embodiment is that the low temperature-cofired multilayered ceramic body 1 is replaced by the cavity type low temperature-cofired multilayered ceramic body 13. The ceramic body having the cavity makes it possible to form a hermetically sealed space in the inside. This makes it possible to make the multilayered ceramic RF device small in size with high performance by incorporating the SAW filter 17, in addition to the bare semiconductor chip 4, inside the device.

The SAW filter utilizes surface acoustic waves propagating over a piezoelectric substrate. Therefore high-frequency characteristics thereof deteriorate significantly when even a minute foreign matter sticks on the surface. Thus the SAW filter must be contained in a package that is hermetically sealed completely. An ordinary SAW package is equipped with only the electrodes for taking out the electrodes of the SAW filter to the outside. The prior art technology has been limited to, at the best, making the package in a multiple layer structure and forming the inner layer capacitor or the inner layer inductor for impedance matching.

The SAW filter utilizes surface acoustic waves propagating over a piezoelectric substrate, and therefore high-frequency characteristics thereof deteriorate significantly when even a minute foreign matter sticks on the surface. Thus the SAW filter must be contained in a package that is hermetically sealed completely. An ordinary SAW package is equipped with only the electrodes for taking out the electrodes of the SAW filter to the outside. The prior art technology has been limited to, at the best, making the package in a multiple layer structure and forming the inner layer capacitor or the inner layer inductor for impedance matching.

With the constitution of this embodiment, on the contrary, not only the inner layer capacitors and the inner layer inductors but also the complex inner layer RF circuit can be formed by making use of the via holes, while at the same time an ultra small device that achieves versatile functions which were not possible with the prior art is realized by combining with the SAW filter, the bare semiconductor chip and other chip components that are mounted in the cavity.

According to this embodiment, as described above, the electrode patterns are formed from copper or silver in the low temperature-cofired multilayered ceramic body that is laminated and fired together, with the electrode patterns being electrically connected by arranging via holes at the desired positions in the ceramic layers and the cavity being formed at the middle of the top surface of the ceramic body. The bare semiconductor chip that operates at a frequency in the UHF band or higher and/or the SAW filter is mounted face down at the bottom of the cavity of the ceramic body, with the cavity space being hermetically sealed with the sealing metal cap. With this constitution, not only the inner layer capacitors and the inner layer inductors but also the complex inner layer RF circuit can be formed by making use of the via holes, while at the same time the multilayered ceramic RF device that achieves versatile functions which were not possible with the prior art is realized by combining with the SAW filter that is mounted in the cavity, the bare semiconductor chip and other chip components. The SAW filter is mounted on the ceramic body, for example, as follows: An electrode surface of the SAW filter is covered with a protective cover (roof) made of resin so that the electrode surface can contact air in the protective cover without directly contacting the ceramic body. The SAW filter is mounted on the ceramic body with a face down bonding through bumps.

Embodiment 6

Now the sixth embodiment of the present invention will be described below with reference to FIG. 13.

Figure 13:
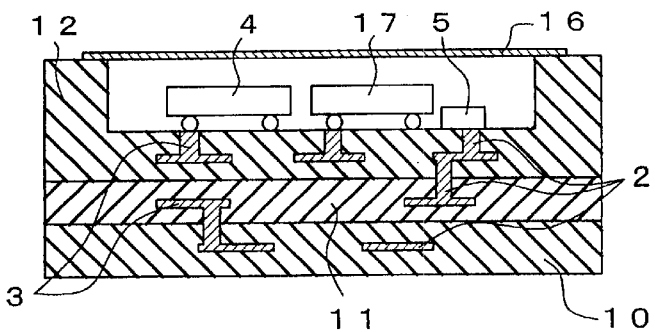
FIG. 13 is a sectional view of a multilayered ceramic RF device according to a sixth embodiment of the present invention.

FIG. 13 is a sectional view of the multilayered ceramic RF device of the sixth embodiment of the present invention. In FIG. 13, reference numeral 10 denotes a low dielectric constant, low temperature-cofired ceramic layer, 11 denotes a high dielectric constant, low temperature-cofired ceramic layer, 12 denotes a cavity type low dielectric constant, low temperature-cofired ceramic layer, 2 denotes an electrode pattern, 3 denotes a via hole, 4 denotes a bare semiconductor chip, 5 denotes a chip component, 16 denotes a sealing metal cap and 17 denotes a SAW filter. This constitution differs from that shown in FIG. 12 in that, instead of the cavity type low temperature-cofired multilayered ceramic body 13, the cavity type low dielectric constant, low temperature-cofired ceramic layer 12 is disposed at the top layer, the high dielectric constant, low temperature-cofired ceramic layer 11 is disposed at the intermediate layer and the low dielectric constant, low temperature-cofired ceramic layer 10 is disposed at the bottom layer.

The operation of the multilayered ceramic RF device having the above constitution will be described below with reference to FIG. 13.

The electrode patterns 2 form inner layer capacitors and inner layer inductors in the cavity type low dielectric constant, low temperature-cofired ceramic layer 12, the low dielectric constant, low temperature-cofired ceramic layer 10 and the high dielectric constant, low temperature-cofired ceramic layer 11, as well as providing electrical connections between a plurality of chip components 5. The chip components 5 include chip resistors, chip capacitors, chip inductors and packaged semiconductors that may be occasionally used. The SAW filter 17 and the bare semiconductor chip 4 are also mounted in the cavity formed in the top surface of the ceramic body. The electrode patterns formed in the heterogeneous laminated low temperature-cofired ceramic body that is laminated and fired together are made of copper or silver, and the electrode patterns are electrically connected by arranging via holes at desired positions in the ceramic layers. The electrode patterns may also be formed in the cavity type low dielectric constant, low temperature-cofired ceramic-layer 12 of the top layer, thereby making it possible to make the device smaller. The ceramic body normally has side face terminal electrodes formed on the side faces thereof for the connection with the outside, although not shown in the drawing. These components collectively constitute the RF circuit and achieve the functions of the multilayered ceramic RF device that includes, for example, the mutilayered RF switches.

A major difference between this constitution and that of the fifth embodiment is that the cavity type low temperature-cofired multilayered ceramic body 13 is replaced by the heterogeneous multilayered structure where the cavity type low dielectric constant, low temperature-cofired ceramic layer 12 is disposed at the top layer, the high dielectric constant, low temperature-cofired ceramic layer 12 is disposed at the intermediate layer and the low dielectric constant, low temperature-cofired ceramic layer IQ is disposed at the bottom layer.

The length of a strip line resonator can be, in general, decreased in inverse proportion to the square root of the relative dielectric constant. Therefore, in case strip line electrodes formed in the high dielectric constant ceramic layer are used for the strip line resonator, wavelength in the dielectric layer can be decreased. Thus the high dielectric constant ceramic layer is suited to form a small strip line resonator. When a ceramic layer having small dielectric loss is used, a strip line resonator that has a high quality factor Q can be formed. However, strip lines have normally low characteristic impedance. For example, a strip line having a minimum line width of 100 $\mu$m and shield distance of 2 mm, that can be formed by screen printing, has characteristic impedance in a range from 20 to 30 ohms, and it is practically impossible to form a line of 50 ohms. Also the high relative dielectric constant makes it easy to make the inner layer capacitor of large capacitance with a small area.

As to the strip line formed in the low dielectric constant ceramics, while the wavelength cannot be decreased much, high characteristic impedance of 50 ohms or higher can be easily realized, and an inner layer inductor can also be easily formed. Because of the low relative dielectric constant, electromagnetic coupling between strip lines that are located near to each other is relatively weak, that is suited for forming electrode patterns.

As described above, by providing the heterogeneous junction of the ceramic sheets having two or more different values of relative dielectric constant and by arranging optimum circuit components in the layers, small size and high performance can be achieved at the same time. Relative dielectric constant of the ceramic layer is preferably set, in consideration of the relationship with the characteristic impedance of the strip lines, below 10 for the top layer, 10 or higher and more preferably from about 40 to 60 for the intermediate layer, and below 10 for the bottom layer.

The reason for employing the structure of sandwiching the high dielectric constant, low temperature-cofired ceramic layer 11 by the cavity type low dielectric constant, low temperature-cofired ceramic layer 12 and the low dielectric constant, low temperature-cofired ceramic layer 10 is for the purpose of preventing the ceramic body from warping during cofiring due to the difference in the thermal expansion coefficient, by making the structure vertically symmetrical with respect to the central horizontal plane.

According to this embodiment, as described above, the multilayered ceramic RF device that can achieve small size and high performance at the same time is provided, by employing a heterogeneous multilayered ceramic body comprising ceramic layers of different relative dielectric constants. The heterogeneous multilayered ceramic body is formed from three or more ceramic layers of different relative dielectric constants, with the top layer being the cavity type low dielectric constant, low temperature-cofired ceramic layer having relative dielectric constant below 10, the intermediate layer being the high dielectric constant, low temperature-cofired ceramic layer having relative dielectric constant of 10 or higher, and the bottom layer being the low dielectric constant, low temperature-cofired ceramic layer having relative dielectric constant below 10.

Embodiment 7

Figure 14:
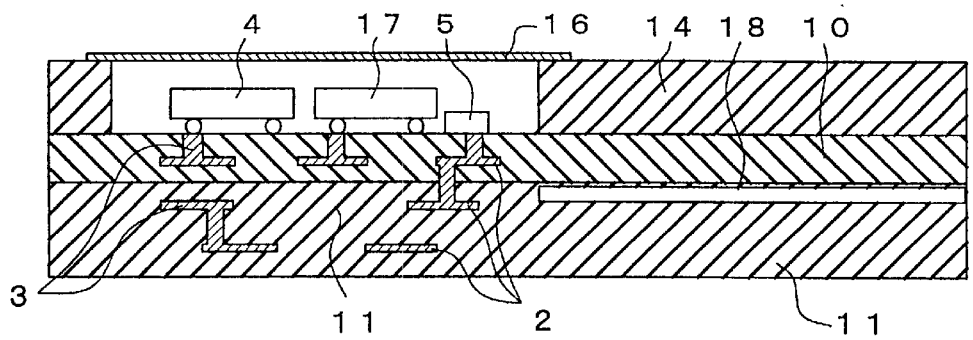
FIG. 14 is a sectional view of a multilayered ceramic RF device according to a seventh embodiment of the present invention.
Figure 15:
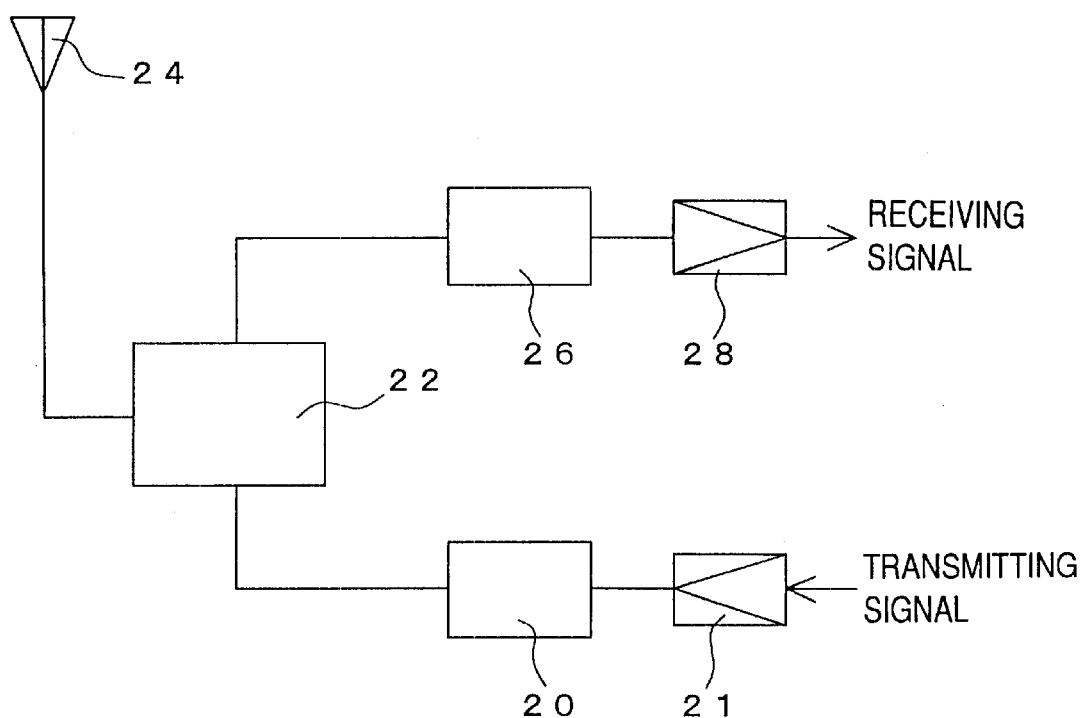
FIG. 15 is a block diagram of a RF circuit.
Figure 16:
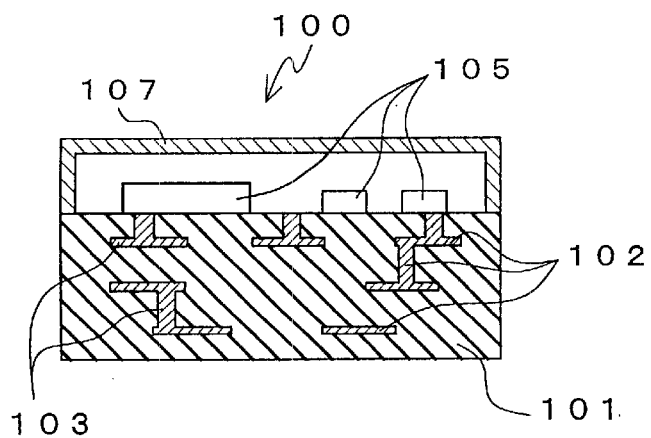
FIG. 16 is a sectional view of a multilayered ceramic RF device of the prior art.

FIG. 14 is a sectional view of the multilayered ceramic RF device of the seventh embodiment of the present invention. In FIG. 14, reference numeral 14 denotes a high dielectric constant, low temperature-cofired ceramic layer with an aperture, 10 denotes a low dielectric constant, low temperature-cofired ceramic layer, 11 denotes a high dielectric constant, low temperature-cofired ceramic layer, 2 denotes an electrode pattern, 3 denotes a via hole, 4 denotes a bare semiconductor chip, 5 denotes a chip component, 16 denotes a sealing metal cap, 17 denotes a SAW filter and 18 denotes a strip line resonator electrode. This constitution has two major differences from that shown in FIG. 13. First, the high dielectric constant ceramic, low temperature-cofired layer with aperture 14 is disposed at the top layer, the low dielectric constant, low temperature-cofired ceramic layer 10 is disposed at the intermediate layer and the high dielectric constant, low temperature-cofired ceramic layer 11 is disposed at the bottom layer. The order of laminating the layer having high dielectric constant and the layer having low dielectric constant is reversed from that of FIG. 13. Second, the cavity is located nearer to one edge of the rectangular top surface of the ceramic body, and, the strip line resonator electrode 18 is embedded in the inner layer in the portion where the cavity does not exist.

The operation of the multilayered ceramic RF device having the above constitution will be described below with reference to FIG. 14.

The electrode patterns 2 form inner layer capacitors and inner layer inductors in the high dielectric constant, low temperature-cofired ceramic layer with aperture 14, the low dielectric constant, low temperature-cofired ceramic layer 10 and the high dielectric constant, low temperature-cofired ceramic layer 11, as well as providing electrical connections between a plurality of chip components 5. The chip components 5 include chip resistors, chip capacitors, chip inductors and packaged semiconductors that may be occasionally used. The electrode patterns formed in the low temperature-cofired ceramic body that is laminated and fired together are made of copper or silver, and the electrode patterns are electrically connected by arranging via holes at desired positions in the ceramic layers. The electrode patterns of the plurality of ceramic layers are formed by screen printing or the like, and the via holes are formed by making holes in the dielectric sheet by a puncher and filling the holes with a conductive paste by printing or other method. The cavity is also formed by making a hole in the dielectric sheet by a puncher, with the cavity space being hermetically sealed with the sealing metal cap. The ceramic body has side face terminal electrodes formed on the side faces thereof for the connection with the outside, although not shown in the drawing. These components collectively constitute the RF circuit and achieve, for example, the functions of the multilayered ceramic RF device that includes, for example, the mutilayered RF switches.

This constitution has two major differences from that of the sixth embodiment. First, the high dielectric constant, low temperature-cofired ceramic layer with aperture 14 is disposed at the top layer, the low dielectric constant, low temperature-cofired ceramic layer 10 is disposed at the intermediate layer and the high dielectric constant, low temperature-cofired ceramic layer 11 is disposed at the bottom layer. The order of laminating the layer having high dielectric constant and the layer having low dielectric constant is reversed from that of the second, fourth and sixth embodiments. Second, the cavity is located nearer to one edge of the rectangular top surface of the ceramic body, and the strip line resonator electrode 18 is embedded in the inner layer in the portion near the other edge where-the cavity does not exist.

This constitution has such effects that the cavity where the SAW filter and the bare semiconductor chip are mounted can be formed and sufficient thickness of the strip line resonator electrode can be secured without increasing the height of the device. In general, the strip line resonator has a higher quality factor Q as the thickness between a strip line and a ground conductor is larger. A low-loss filter can be made by using such strip line resonators.

It goes without saying that other effects can be achieved similarly to the other embodiments.

According to this embodiment, as described above, the electrode patterns are formed from copper or silver in the low temperature-cofired multilayered ceramic body that is laminated and fired together, with the electrode patterns being electrically connected by arranging via holes at the desired positions in the ceramic layers and a cavity being formed at the position nearer to one edge of the top surface of the ceramic body. The bare semiconductor chip that operates at a frequency in the UHF band or higher and/or the SAW filter is mounted face down at the bottom of the cavity of the ceramic body, with the cavity space being hermetically sealed with the sealing metal cap, and the strip line resonator electrode is embedded near the other edge of the ceramic body. In the constitution described above, the heterogeneous, multilayered ceramic body comprising three or more ceramic layers having different relative dielectric constants may be used, wherein the high dielectric constant, low temperature-cofired ceramic layer with aperture having a relative dielectric constant of 10 or higher is disposed at the top layer thereby forming the wall surface of the cavity, the low dielectric constant, low temperature-cofired ceramic layer having a relative dielectric constant below 10 is disposed at the intermediate layer and the high dielectric constant, low temperature-cofired ceramic layer having a relative dielectric constant of 10 or higher is disposed at the bottom layer. The strip line resonator electrode is also embedded in the heterogeneous multilayered ceramic body comprising three or more layers. With this constitution, not only the simple inner layer capacitors and the inner layer inductors but also the complex inner layer RF circuit can be formed by making use of the via holes without increasing the height of the device. At the same time, the multilayered ceramic RF device that achieves versatile functions with a low profile which were not possible with the prior art is realized by combining with the SAW filter mounted in the cavity, the bare semiconductor chip and other chip components, and the strip line resonator having a high quality factor Q.

According to the present invention, as described above, the multilayered ceramic RF device having excellent high-frequency characteristics and high reliability can be provided. Also the multilayered ceramic RF device has high performance, small size and low profile and can be easily produced.

Although the present invention has been fully described by way of examples with reference to the accompanying drawings, it is to be noted here that various changes and modifications will be apparent to those skills in the art. Therefore, unless such changes and modifications otherwise depart from the spirit and scope of the present invention, they should be constructed as being included therein.

What is claimed is:

1. A multilayered ceramic RF device comprising:
   a low temperature-cofired multilayered ceramic body having a plurality of ceramic layers laminated one upon another and fired together, said low temperature-cofired multilayered ceramic body also having a first electrode pattern formed therein and a second electrode pattern formed therein, said first and second electrode patterns being electrically connected to one another through a via hole;
   at least one radio frequency multilayered filter formed in said low temperature-cofired multilayered ceramic body, and said multilayered filter including a part of said first and second electrode patterns; and
   a bare semiconductor chip mounted on said low temperature-cofired multilayered ceramic body with a face down bonding so as to be located over one of said at least one radio frequency multilayered filter, said bare semiconductor chip being coated with a sealing resin.

2. A multilayered ceramic RF device according to claim 1,
   wherein said multilayered filter is a distributed constant multilayered filter having a strip line resonator which includes a strip line resonator electrode formed as said part of said first and second electrode patterns.

3. A multilayered ceramic RF device according to claim 1,
   wherein said multilayered filter is a lumped constant multilayered filter having a capacitor electrode and an inductor electrode, both of said capacitor electrode and said inductor electrode being formed as said part of said first and second electrode patterns.

4. A multilayered ceramic RF device according to claim 1, further comprising two or more radio frequency filters,
   wherein at least one of said two or more radio frequency filters is a SAW filter.

5. A multilayered ceramic RF device according to claim 1,
   wherein said low temperature-cofired multilayered ceramic body has a cavity formed therein substantially at a center thereof; and
   wherein said bare semiconductor chip is mounted at a bottom of said cavity and said sealing resin is filled in said cavity so as to cover said bare semiconductor chip.

6. A multilayered ceramic RF device according to claim 1,
   wherein said plurality of ceramic layers includes a first ceramic layer with a first relative dielectric constant and a second ceramic layer with a second relative dielectric constant different from said first relative dielectric constant.

7. A multilayered ceramic RF device according to claim 6,
   wherein said plurality of ceramic layers includes a top layer, a bottom layer, and an intermediate layer sandwiched between said top layer and said bottom layer;
   wherein said intermediate layer is formed of said first ceramic layer, and both said top layer and said bottom layer are formed of said second ceramic layer; and
   wherein said first relative dielectric constant is greater than or equal to 10, and said second relative dielectric constant is smaller than 10.

8. A multilayered ceramic RF device comprising:

a low temperature-cofired multilayered ceramic body having a plurality of ceramic layers laminated one upon another and fired together, said low temperature-cofired multilayered ceramic body also having a first electrode pattern formed therein and a second electrode pattern formed therein, said first and second electrode patterns being electrically connected to one another through a via hole;

a radio frequency multilayered filter formed in said low temperature-cofired multilayered ceramic body, said multilayered filter including a part of said first and second electrode patterns; and a radio frequency SAW filter mounted on said low temperature-cofired multilayered ceramic body, said SAW filter being positioned over said multilayered filter.

9. A multilayered ceramic RF device according to claim 8, wherein said SAW filter and said multilayered filter are connected electrically by a via hole.

10. A multilayered ceramic RF device according to claim 8, wherein said multilayered filter is a distributed constant multilayered filter having a strip line resonator which includes a strip line resonator electrode formed as said part of said first and second electrode patterns.

11. A multilayered ceramic RF device according to claim 8, wherein said multilayered filter is a lumped constant multilayered filter having a capacitor electrode and an inductor electrode, both of said capacitor electrode and said inductor electrode being formed as said part of said first and second electrode patterns.

12. A multilayered ceramic RF device according to claim 8, wherein said low temperature-cofired multilayered ceramic body has a cavity formed therein at a center thereof;

wherein said SAW filter is mounted at a bottom of said cavity, and said cavity is covered by a sealing metal cap.

13. A multilayered ceramic RF device according to claim 8, wherein said plurality of ceramic layers includes a first ceramic layer with a first relative dielectric constant and a second ceramic layer with a second relative dielectric constant different from said first relative dielectric constant.

14. A multilayered ceramic RF device according to claim 8, further comprising a radio frequency switching circuit including a capacitor electrode and an inductor electrode;

wherein said first and second electrode patterns formed in said low temperature-cofired multilayered ceramic body include at least one of said capacitor electrode and said inductor electrode.

15. A multilayered ceramic RF device according to claim 14, wherein said multilayered ceramic RF device is used for both of a W-CDMA and a GSM, and wherein the multilayered filter is a transmitting filter for the W-CDMA, the SAW filter is a receiving filter for the W-CDMA, and the radio frequency switching circuit is a switching duplexer for the GSM.

16. A multilayered ceramic RF device comprising:

a low temperature-cofired multilayered ceramic body having a plurality of ceramic layers laminated one upon another and fired together, a first electrode pattern formed therein and a second electrode pattern formed therein, said first and second electrode patterns being electrically connected to one another through a via hole;

a radio frequency multilayered filter formed in said low temperature-cofired multilayered ceramic body, said multilayered filter including a part of said first and second electrode patterns;

a bare semiconductor chip mounted on a surface of said low temperature-cofired multilayered ceramic body; and a radio frequency SAW filter mounted on the same surface of said low temperature-cofired multilayered ceramic body as said bare semiconductor chip.

17. A multilayered ceramic RF device according to claim 16, wherein said semiconductor chip and said SAW filter are connected electrically by using a micro strip line formed on said surface of said low temperature-cofired multilayered ceramic body.

18. A multilayered ceramic RF device according to claim 16, wherein said multilayered filter is a distributed constant multilayered filter having a strip line resonator which includes a strip line resonator electrode formed as said part of said first and second electrode patterns.

19. A multilayered ceramic RF device according to claim 16, wherein said multilayered filter is a lumped constant multilayered filter having a capacitor electrode and an inductor electrode, both of said capacitor electrode and said inductor electrode being formed as said part of said first and second electrode patterns.

20. A multilayered ceramic RF device according to claim 16, wherein said low temperature-cofired multilayered ceramic body has a cavity formed therein at the center thereof; and wherein said SAW filter and said bare semiconductor chip are mounted at a bottom of said cavity, and said cavity being covered by a sealing metal cap.

21. A multilayered ceramic RF device according to claim 16, wherein said plurality of ceramic layers includes a first ceramic layer with a first relative dielectric constant and a second ceramic layer with a second relative dielectric constant different from said first relative dielectric constant.

22. A multilayered ceramic RF device according to claim 16, further comprising a radio frequency switching circuit including a capacitor electrode and an inductor electrode;

wherein said first and second electrode patterns formed in said low temperature-cofired multilayered ceramic body include at least one of said capacitor electrode and said inductor electrode.

23. A multilayered ceramic RF device according to claim 22, wherein said multilayered ceramic RF device is used for both of a W-CDMA and a GSM, and wherein said multilayered filter is a transmitting filter for the W-CDMA, said SAW filter is a receiving filter for the W-CDMA, and said radio frequency switching circuit is a switching duplexer for the GSM.

* * * * *